(12) United States Patent
Kobayashi et al.

(10) Patent No.: US 10,937,711 B2
(45) Date of Patent: Mar. 2, 2021

(54) ELECTRONIC DEVICE AND METHOD FOR MANUFACTURING SAME

(71) Applicant: DENSO CORPORATION, Kariya (JP)

(72) Inventors: Wataru Kobayashi, Kariya (JP); Kazuki Koda, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/382,323

(22) Filed: Apr. 12, 2019

(65) Prior Publication Data
US 2019/0237378 A1 Aug. 1, 2019

Related U.S. Application Data

(63) Continuation of application No. PCT/JP2017/028285, filed on Aug. 3, 2017.

(30) Foreign Application Priority Data

Oct. 18, 2016 (JP) .............................. JP2016-204479
Oct. 18, 2016 (JP) .............................. JP2016-204480

(51) Int. Cl.
| | | |
|---|---|---|
| H01L 23/31 | (2006.01) |
| H01L 23/495 | (2006.01) |
| H01L 23/00 | (2006.01) |
| H01L 21/48 | (2006.01) |
| B23K 26/354 | (2014.01) |

(Continued)

(52) U.S. Cl.
CPC .......... *H01L 23/3142* (2013.01); *B23K 26/00* (2013.01); *B23K 26/354* (2015.10); *B29C 65/00* (2013.01); *H01L 21/4821* (2013.01); *H01L 23/49513* (2013.01); *H01L 23/49541* (2013.01); *H01L 23/50* (2013.01); *H01L 24/32* (2013.01);

(Continued)

(58) Field of Classification Search
CPC ........... H01L 23/3142; H01L 23/49541; H01L 23/49582; B23K 26/355
See application file for complete search history.

(56) References Cited

U.S. PATENT DOCUMENTS

| | | | | |
|---|---|---|---|---|
| 1,099,302 A | * | 6/1914 | Hult ........................ | E01B 11/10 238/192 |
| 5,499,668 A | | 3/1996 | Katayama et al. | |

(Continued)

FOREIGN PATENT DOCUMENTS

| | | | |
|---|---|---|---|
| JP | 4472773 B1 | * | 6/2010 |
| JP | 2010-161098 A | | 7/2010 |
| JP | 2013-111881 A | | 6/2013 |

*Primary Examiner* — David A Zarneke
(74) *Attorney, Agent, or Firm* — Posz Law Group, PLC

(57) ABSTRACT

An electronic device includes: a support member that has a metallic placement surface joined to the conductive bonding layer, and a metallic sealing surface provided on an outer side of the placement surface in an in-plane direction of the placement surface to adjoin the placement surface and to surround the placement surface; and a resin member, which is a synthetic resin molded article, joined to the sealing surface and covering the electronic component. The sealing surface includes a rough surface having a plurality of laser irradiation marks having a substantially circular shape. The rough surface includes a first region and a second region. The second region has a higher density of the laser irradiation marks in the in-plane direction than the first region.

6 Claims, 18 Drawing Sheets

(51) Int. Cl.
*B29C 65/00* (2006.01)
*H01L 23/50* (2006.01)
*B23K 26/00* (2014.01)

(52) U.S. Cl.
CPC .............................. *H01L 23/3107* (2013.01); *H01L 2224/27013* (2013.01); *H01L 2224/32245* (2013.01)

(56) References Cited

U.S. PATENT DOCUMENTS

| | | | | |
|---|---|---|---|---|
| 6,197,615 B1* | 3/2001 | Song | ................. | H01L 23/49503 438/111 |
| 6,893,742 B2* | 5/2005 | Chen | ........................ | C25D 1/04 428/336 |
| 7,190,057 B2* | 3/2007 | Seki | ......................... | C25D 5/12 257/678 |
| 7,808,089 B2* | 10/2010 | Nguyen | ................. | H01L 24/97 257/676 |
| 8,367,479 B2* | 2/2013 | Nakamura | ........ | H01L 23/49582 438/123 |
| 8,373,258 B2* | 2/2013 | Mizusaki | .......... | H01L 23/49541 257/676 |
| 8,420,446 B2* | 4/2013 | Yo | ..................... | H01L 23/49582 438/123 |
| 8,449,987 B2* | 5/2013 | Kobayashi | ................ | C22C 9/06 428/570 |
| 8,564,107 B2* | 10/2013 | Cho | .................. | H01L 23/49582 257/666 |
| 8,739,401 B2* | 6/2014 | Shimazaki | .......... | H01L 23/3107 29/846 |
| 8,945,951 B2* | 2/2015 | Park | .................. | H01L 23/49548 438/10 |
| 9,093,434 B2* | 7/2015 | Kimura | ................. | H01L 21/565 |
| 9,224,915 B2* | 12/2015 | Mineshita | ................ | H01L 33/54 |
| 9,397,037 B2* | 7/2016 | Yasunaga | .......... | H01L 23/49582 |
| 9,517,532 B2* | 12/2016 | Kobayashi | ........... | B23K 26/355 |
| 9,679,832 B1* | 6/2017 | Heng | ................ | H01L 23/49575 |
| 9,831,158 B2* | 11/2017 | Hayashi | ............ | H01L 23/49503 |
| 10,199,302 B1* | 2/2019 | Sanchez | .................. | H01L 23/36 |
| 10,692,792 B2* | 6/2020 | Fujita | ..................... | H01L 23/28 |
| 2013/0098659 A1* | 4/2013 | Kwan | ............... | H01L 23/49582 174/126.2 |
| 2016/0207148 A1 | 7/2016 | Kobayashi et al. | | |
| 2019/0311974 A1* | 10/2019 | Hashizume | ............. | H01L 24/32 |

* cited by examiner

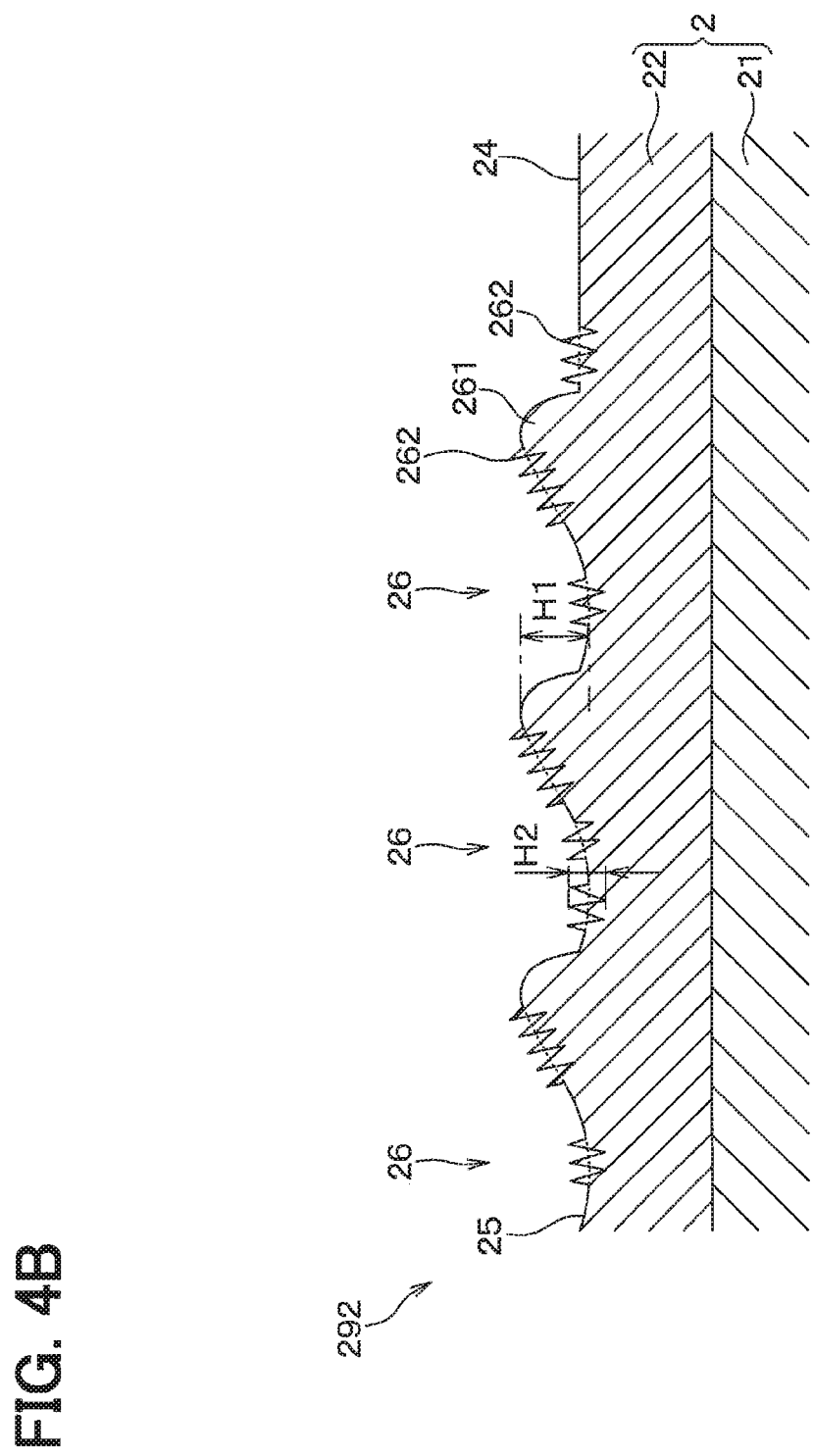

ELECTRONIC DEVICE AND METHOD FOR MANUFACTURING SAME

CROSS REFERENCE TO RELATED APPLICATIONS

The present application is a continuation application of International Patent Application No. PCT/JP2017/028285 filed on Aug. 3, 2017, which designated the U.S. and claims the benefit of priority from Japanese Patent Application No. 2016-204479 filed on Oct. 18, 2016 and Japanese Patent Application No. 2016-204480 filed on Oct. 18, 2016. The entire disclosures of all of the above applications are incorporated herein by reference.

TECHNICAL FIELD

The present disclosure relates to an electronic device and a method for manufacturing the electronic device.

BACKGROUND

A semiconductor device, which has a structure with an electronic component (e.g., an IC chip) bonded to a metal surface and a resin member in tight contact with the metal surface, is subjected to improvement.

SUMMARY

The present disclosure describes an electronic device mounted with an electronic component and a method for manufacturing the electronic device.

BRIEF DESCRIPTION OF DRAWINGS

FIG. 4B is a partially enlarged cross-sectional view of the support member shown in FIG. 1.

DETAILED DESCRIPTION

Figure 1:
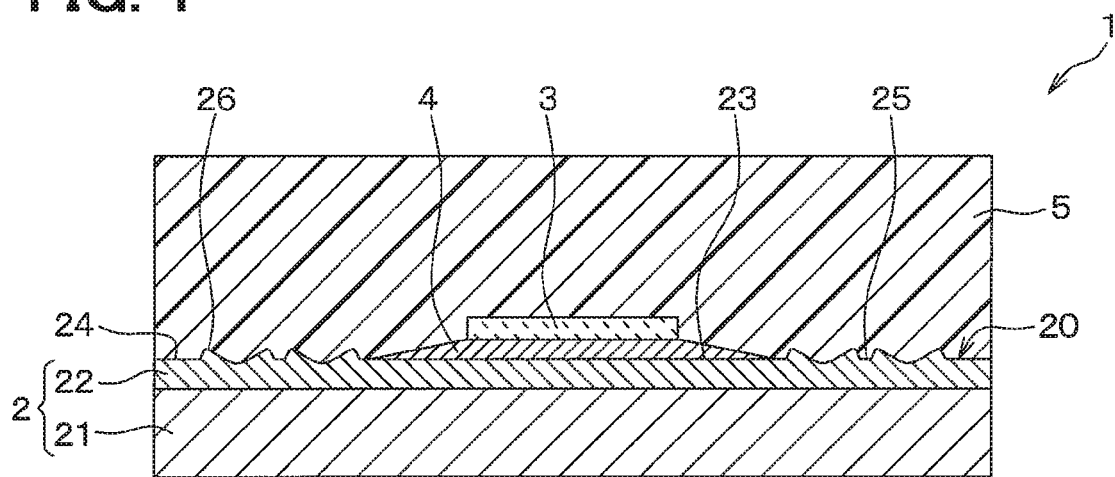
FIG. 1 is a cross-sectional view illustrating a schematic configuration of an electronic device of a first embodiment.

A technique for making a metal surface rough by laser beam irradiation to enhance bonding between a resin member and a metal surface in a semiconductor device is subjected to improvement. Thus, a further improvement in the bonding between the metal surface and the resin member has been demanded.

In an electronic device according to a first aspect of the present disclosure, an electronic component is mounted through a conductive bonding layer. The electronic device includes; a support member having a metallic placement surface joined to the conductive bonding layer, and a metallic sealing surface provided on an outer side of the placement surface in an in-plane direction of the placement surface to adjoin the placement surface and to surround the placement surface; and a resin member, which is a synthetic resin molded article, joined to the sealing surface and covering the electronic component. The sealing surface includes a rough surface having a plurality of laser irradiation marks having a substantially circular shape. The rough surface includes a first region and a second region, which has a higher density of the laser irradiation marks in the in-plane direction than the first region. The second region is provided correspondingly to a desirable portion, for example, a portion of a joint between the support member and the conductive bonding layer or between the support member and the resin member where internal stress is higher than in other portions of the joint. Therefore, the bonding between the resin member and the metallic sealing surface at the support member is further improved.

In an electronic device according to a second aspect of the present disclosure, an electronic component is mounted through a conductive bonding layer. The electronic device includes: a support member that includes a metallic placement surface joined to the conductive bonding layer, and a metallic sealing surface provided on an outer side of the placement surface in an in-plane direction of the placement surface to adjoin the placement surface and to surround the placement surface; and a resin member that is a synthetic resin molded article joined to the sealing surface and covering the electronic component.

In the above-mentioned configuration, the rough surface with the laser irradiation marks is formed on the sealing surface of the support member. The rough surface is provided correspondingly to a portion of a joint between the support member and the conductive bonding layer or between the support member and the resin member. Internal stress is higher at the portion of the joint than in other portions of the joint. Therefore, the bonding between the resin member and the metallic sealing surface at the support member is further improved.

A manufacturing method related to a third aspect of the present disclosure is a method for manufacturing an electronic device in which an electronic component is mounted through a conductive bonding layer.

The manufacturing method related to the third aspect of the present disclosure includes: forming a metallic sealing surface by irradiating, with a pulsed laser beam, a portion of one planar metal surface of a support member; mounting the electronic component on the support member through the conductive bonding layer by joining the conductive bonding layer to a placement surface that includes the non-laser-irradiated region; and covering the electronic component with a resin member, which is a synthetic resin molded article, by joining the resin member to the sealing surface. The sealing surface is formed on an outer side of a non-laser-irradiated region of the planar metal surface in an in-plane direction of the planar metal surface, the non-laser-irradiated region being closer to a central portion of the planar metal surface in the in-plane direction. The sealing surface includes a rough surface having a plurality of laser irradiation marks having a substantially circular shape, while the non-laser-irradiated region is free of the laser irradiation marks. The rough surface includes a first region and a second region, the second region having a higher density of the laser irradiation marks in the in-plane direction than the first region.

An electronic device can be manufactured with the manufacturing method related to the third aspect in an improving manner.

A manufacturing method related to a fourth aspect of the present disclosure is a method for manufacturing an electronic device in which an electronic component is mounted through a conductive bonding layer. The manufacturing method includes; forming a metallic sealing surface by irradiating, with a pulsed laser beam, a portion of one planar metal surface of a support member; mounting the electronic component on the support member through the conductive bonding layer by joining the conductive bonding layer to a placement surface that includes the non-laser-irradiated region; and covering the electronic component with a resin member, which is a synthetic resin molded article, by joining the resin member to the rough surface. The sealing surface is formed on an outer side of a non-laser-irradiated region of the planar metal surface in an in-plane direction of the planar metal surface, the non-laser-irradiated region being closer to a central portion of the planar metal surface in the in-plane direction. The sealing surface includes a rough surface having a plurality of laser irradiation marks having a substantially circular shape, while the non-laser-irradiated region is free of the laser irradiation marks. The sealing surface is formed at a position corresponding to a portion of a joint between the support member and the conductive bonding layer or between the support member and the resin member, and internal stress is higher at the portion of the joint with the sealing surface than in other portions of the joint.

An electronic device can be manufactured with the manufacturing method related to the fourth aspect in an improving manner.

In an electronic device according to a fifth aspect of the present disclosure, an electronic component is mounted through a conductive bonding layer. The electronic device includes; a support member having a metallic placement surface joined to the conductive bonding layer, and a metallic sealing surface provided on an outer side of the placement surface in an in-plane direction of the placement surface to adjoin the placement surface and to surround the placement surface; and a resin member, which is a synthetic resin molded article, joined to the sealing surface and covering the electronic component. The sealing surface includes a rough surface provided with a plurality of laser irradiation marks each having a substantially circular shape. A boundary area, which is a portion of the placement surface adjoining the sealing surface in the in-plane direction, has an improved wettability for a material providing the conductive bonding layer than the rough surface of the sealing surface.

A manufacturing method according to a sixth aspect of the present disclosure is a method for manufacturing an electronic device in which an electronic component is mounted through a conductive bonding layer. The method includes: forming a metallic sealing surface by irradiating, with a pulsed laser beam as a surface roughening beam, a portion of one planar metal surface of a support member; forming a metallic placement surface on the support member by irradiating a boundary area with a post-processing laser beam such that wettability for a material forming the conductive bonding layer is improved in the boundary area than on the rough surface of the sealing surface; mounting the electronic component on the support member through the conductive bonding layer by joining the conductive bonding layer to the placement surface; and covering the electronic component with a resin member being a synthetic resin molded article by joining the resin member to the sealing surface. The sealing surface is formed on an outer side of a non-laser-irradiated region of the planar metal surface in an in-plane direction of the planar metal surface, the non-laser-irradiated region being closer to a central portion of the planar metal surface in the in-plane direction. The sealing surface includes a rough surface having a plurality of laser irradiation marks having a substantially circular shape, while the non-laser-irradiated region is free of the laser irradiation marks. The placement surface is to be joined to the conductive bonding layer, and includes the boundary area and the non-laser-irradiated region. The boundary area includes an outer edge of the non-laser-irradiated region. The post-processing laser beam has a lower energy level than the surface roughening beam.

With regard to the above configurations and the manufacturing methods, the rough surface having the laser irradiation marks is formed by irradiating the support member with the surface roughen beam. Therefore, the bonding between the resin member and the metallic sealing surface of the support member is further improved. On the other hand, the non-irradiated region of the support member near the central part in the in-plane direction is formed. That is, the sealing surface is formed on the outer side of the non-irradiated region in the in-plane direction.

At this time, deposits accumulate inside and around the laser irradiation marks. The deposits are composed of substances such as the metal that forms the support member and/or compounds and the like (e.g., oxides) of the metal. Accumulation and the like of these deposits create minute irregularities inside and around the laser irradiation marks.

The accumulation of deposits and/or concurrent formation of minute irregularities can also occur in the boundary area that adjoins the sealing surface in the in-plane direction of the placement surface. If this happens, there is a risk that the wettability of the material forming the conductive bonding layer may be deteriorated in the boundary area due to the influence of the compounds and the like mentioned above.

According to the structure and manufacturing method described above, the boundary area is irradiated with the post-processing beam that is a laser beam with a lower energy level than that of the surface roughening beam. The irradiation with the post-processing beam favorably removes the compounds and the like mentioned above, which are one cause of deterioration of the wettability. Thus, the wettability is made more favorable in the boundary area than on the rough surface of the sealing surface. Therefore, a good bond with the conductive bonding layer on the placement surface can be secured, while a favorable bond is also realized between the sealing surface and the resin member.

The embodiments will be described with reference to the drawings below. Parts identical or equivalent to each other in various embodiments and variation examples thereof that are described later are given the same reference numerals. Where applicable, descriptions of previous embodiments can be referred to as required to the embodiments or variations examples that follow, unless there are technical contradictions or otherwise additionally described.

Structure of First Embodiment

The configuration of an electronic device 1 of the present embodiment will be described with reference to FIG. 1 to FIG. 3, FIG. 4A, and FIG. 4B. As shown in FIG. 1, the electronic device 1 includes a support member 2, an electronic component 3, a conductive bonding layer 4, and a resin member 5. For convenience of illustration and description, a graphic indication and presentation of detailed features such as a protective film, wiring, and the like with which the electronic device 1 is commonly provided are omitted in each drawing. For the same reasons, the resin member 5 is not shown in the plan view of FIG. 2.

Figure 2:
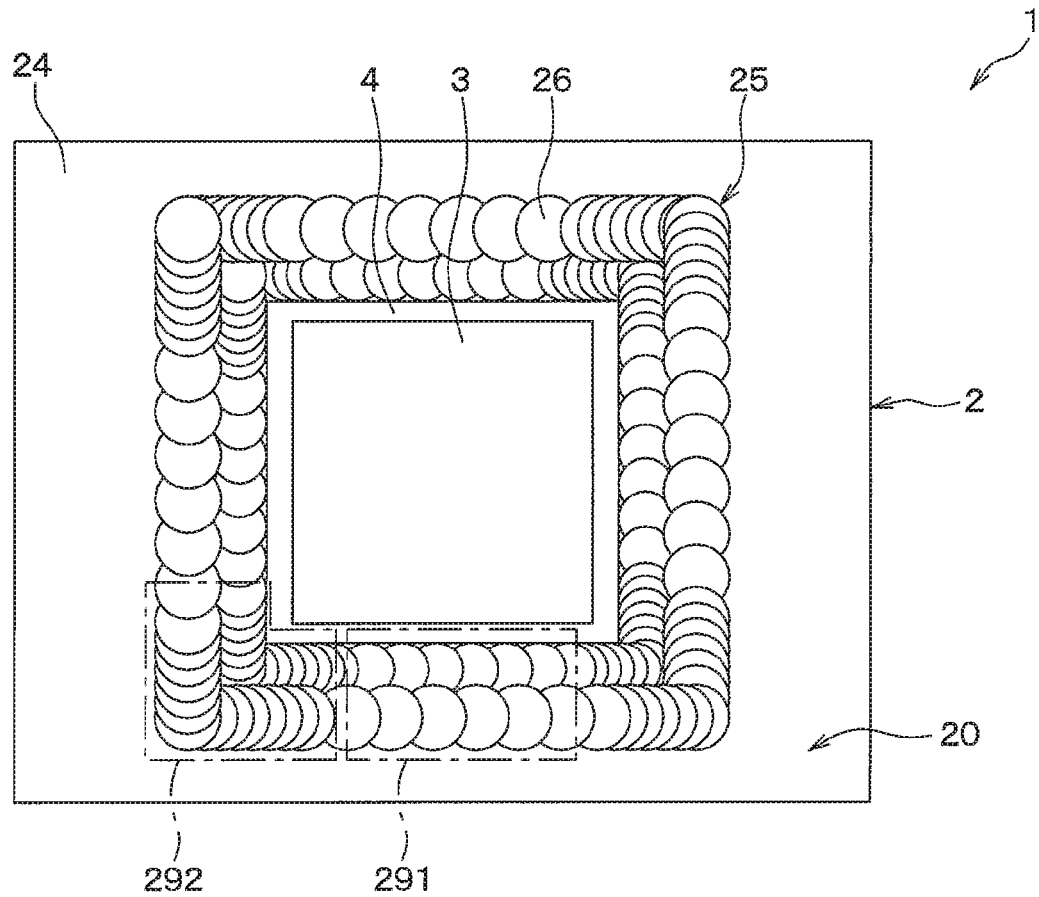
FIG. 2 is a plan view of the electronic device shown in FIG. 1.

The support member 2 is a component that supports the electronic component 3, and formed as a metal member in the present embodiment. More specifically, the support member 2 is a component known as a lead frame and formed in a flat plate shape at least in a section bonded to the electronic component 3 and in its vicinity. The structure of the support member 2 will be described in detail later. In the present embodiment, the electronic component 3 is an IC chip, and has a planar shape that is rectangular as shown in FIG. 2. The "planar shape" here refers to the shape of one of a pair of main surfaces that are the pair of surfaces with the largest area of the electronic component 3 formed in a hexahedron shape, viewed from a direction parallel to the normal of the one of the main surfaces. The "planar shape" may also refer to a shape as viewed in plan, i.e., a shape in a plan view.

The conductive bonding layer 4 is a component for bonding the electronic component 3 on a mounting surface 20 that is one surface of the support member 2, and composed of solder or conductive adhesive. An in-plane direction of the mounting surface 20, i.e., a direction parallel to the mounting surface 20, shall be hereinafter referred to simply as "in-plane direction". The resin member 5 is a synthetic resin molded article and made of a thermosetting or thermoplastic synthetic resin such as epoxy resin, polyamide resin, polyphenylene sulfide resin, polybutylene terephthalate resin, and the like. The electronic device 1 is configured such that it carries the electronic component 3 on the mounting surface 20 of the support member 2 via the conductive bonding layer 4, with the resin member 5 covering the carried electronic component 3 and the mounting surface 20.

The support member 2 has a main body 21 and a metallized layer 22. The main body 21 is made of a metal material having good conductivity, such as Cu, Fe, Ni, Pd, Pt, and Al, for example, or an alloy (e.g., 42 alloy and the like) containing at least one of these metal elements. The metallized layer 22 is a metal thin film formed on the main body 21 and includes the mounting surface 20. Namely, the mounting surface 20 is provided as the surface of the metallized layer 22. In the present embodiment, the metallized layer 22 is formed of a film of a metal material mainly composed of at least one of Ni, Au, Pd, and Ag by plating or the like.

The mounting surface 20 is formed on part of one planar metal surface of the support member 2 by performing a laser beam irradiation treatment for enhancing the joint (i.e., bond) with the resin member 5. More specifically, the mounting surface 20 includes a placement surface 23 and a sealing surface 24. The placement surface 23 is a surface of a metallic nature bonded to the conductive bonding layer 4 and located in a central part in the in-plane direction of the mounting surface 20. The "surface of a metallic nature" is a surface mainly composed of metal and includes a metal surface, and a metal compound surface (e.g., metal oxide surface). In the present embodiment, the placement surface 23 is formed as a metal surface with a good wettability for the material forming the conductive bonding layer 4.

Figure 3:
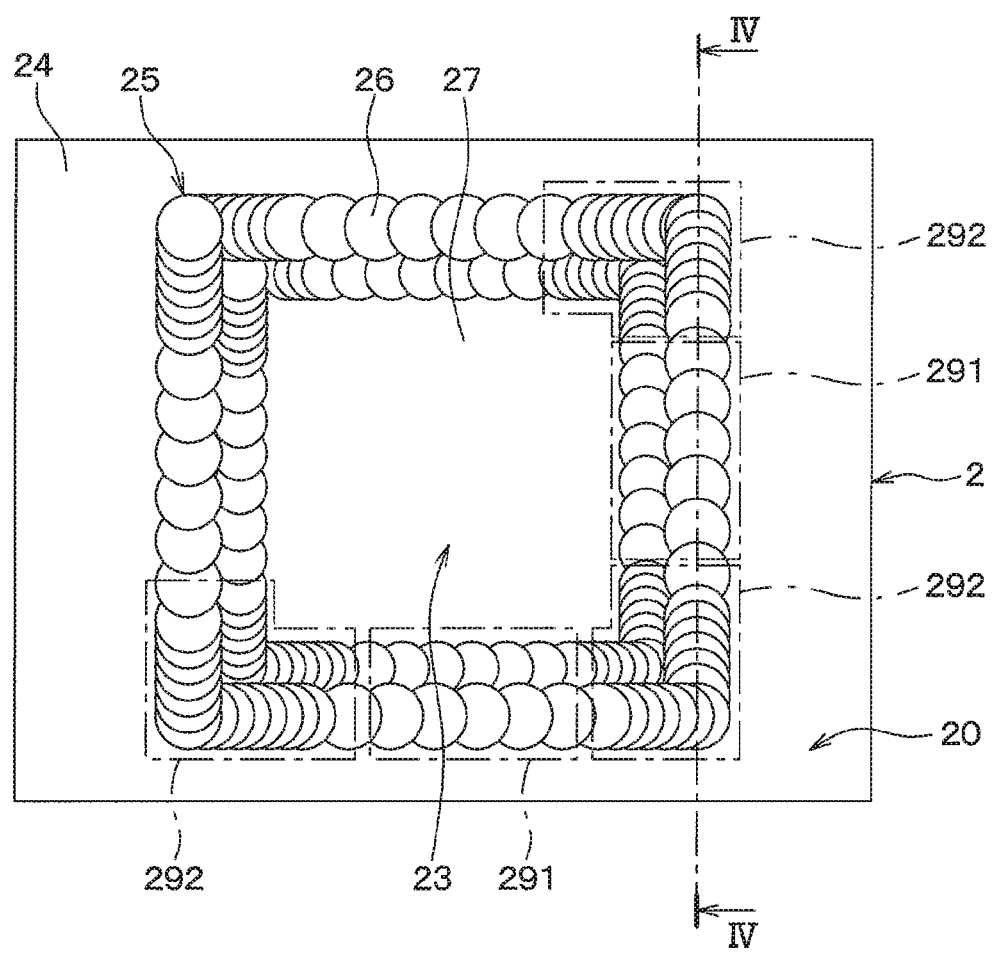
FIG. 3 is a plan view of a support member shown in FIG. 1.

As shown in FIG. 3, the placement surface 23 is formed to have a planar shape that is rectangular corresponding to the rectangular planar shape of the electronic component 3. The sealing surface 24 is a surface of a metallic nature adjoining the placement surface 23 in the in-plane direction, and provided outside the placement surface 23 such as to surround the placement surface 23. The resin member 5 covers the electronic component 3, and is bonded to the sealing surface 24.

The sealing surface 24 includes a rough surface 25. The rough surface 25 is formed by a plurality of laser irradiation marks 26 that are generally circular. The laser irradiation marks 26 are crater-like depressions and protrusions with an outside diameter of 5 µm to 300 µm, and formed by irradiating the mounting surface 20 with a pulsed laser beam. One laser irradiation mark 26 that is generally circular corresponds to one emission of a pulsed laser beam.

As shown in FIG. 3, in the present embodiment, the rough surface 25 is formed in a rectangular shape as viewed in plan, with a predetermined line width, more specifically a width corresponding to twice as large as the outside diameter of a laser irradiation mark 26. Namely, there is formed a non-laser-irradiated region 27 without the laser irradiation marks 26 on the inner side in the in-plane direction of the rough surface 25 in the rectangular shape on the sealing surface 24. In the present embodiment, there is also formed a region that does not have laser irradiation marks 26 on the outer side in the in-plane direction of the rough surface 25 on the sealing surface 24.

As noted above, the rough surface 25 is formed by irradiating the outer side in the in-plane direction of the non-laser-irradiated region 27 that is located closer to the central part in the in-plane direction of the mounting surface 20 with a pulsed laser beam. This non-laser-irradiated region 27 forms a major part of the placement surface 23. More specifically, in the present embodiment, the placement surface 23 generally overlaps with the non-laser-irradiated region 27.

The rough surface 25 includes a first region 291 and a second region 292. A plurality of laser irradiation marks 26 are formed each in the first region 291 and second region 292. The second region 292 has a higher density of laser irradiation marks 26 in the in-plane direction than that of the first region 291. More specifically, in the present embodiment, the second region 292 is formed by setting the laser beam irradiation density 1.25 times or more higher than that of the first region 291.

In the present embodiment, the second region 292 is provided correspondingly to portions of the joint between the support member 2 and the conductive bonding layer 4 and resin member 5 where internal stress is higher than other parts. More specifically, the second region 292 is provided in areas near four corners of the rectangular shape of the electronic component 3. Namely, the second region 292 is provided in corner parts of the planar shape of the rough surface 25 that is rectangular.

Figure 4A:
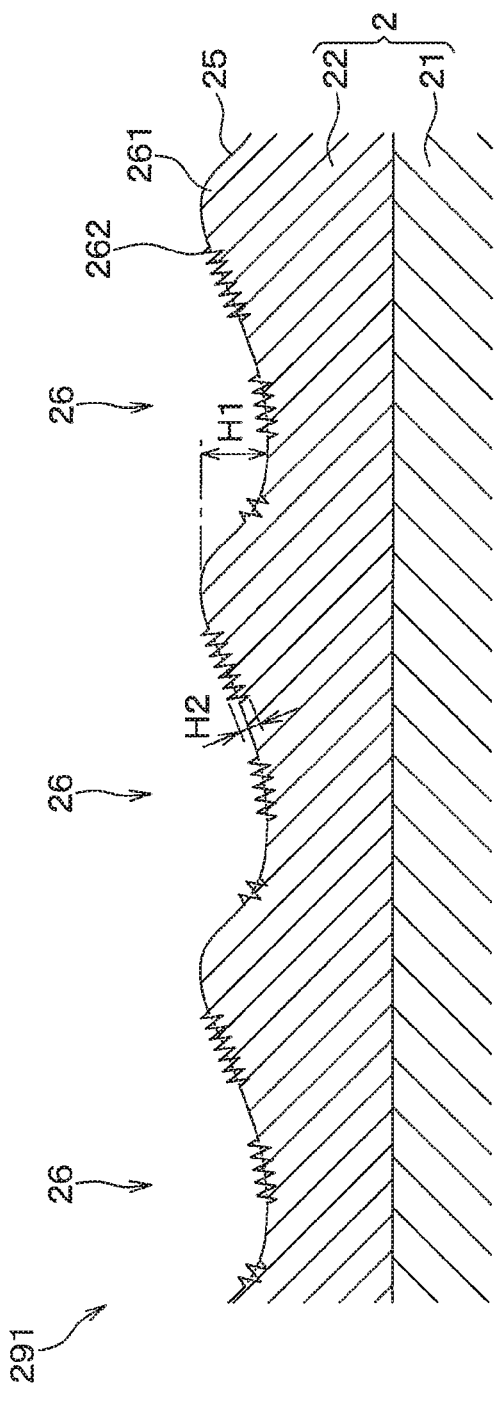
FIG. 4A is a partially enlarged cross-sectional view of the support member shown in FIG. 1.

FIG. 4A shows a part of the IV-IV section of FIG. 3 corresponding to the first region 291. FIG. 4B shows a part of the IV-IV section of FIG. 3 corresponding to the second region 292. As shown in FIG. 4A and FIG. 4B, a plurality of first protrusions 261 and a plurality of second protrusions 262 are formed in the rough surface 25.

The first protrusions 261 are protruded parts formed along an outer edge of laser irradiation marks 26 in a crater shape and have a height of 0.5 µm to 5 µm. The height of the first protrusion 261, the definition of which will be given later, is indicated with an arrow H1 in FIG. 4A and FIG. 4B.

The second protrusions 262 are protruded parts formed inside the first protrusions 261 and around the first protrusions 261 and have a height of 1 nm to 500 nm and a width of 1 nm to 300 nm. Namely, the second protrusions 262 are formed inside the laser irradiation marks 26 and around the laser irradiation marks 26. The second protrusions 262 in the second region 292 are formed higher than the second protrusions 262 in the first region 291. The height of the second protrusion 262, the definition of which will be given later, is indicated with an arrow H2 in FIG. 4A and FIG. 4B.

The second protrusions 262 have a width of 1 nm to 300 nm. The definition of the width of the second protrusions 262 will also be given later. The rough surface 25 is formed such that two adjacent second protrusions 262 are spaced apart by 1 nm to 300 nm.

As noted above, the second protrusions 262 have a height that is sufficiently smaller than the height of the first protrusions 261. Therefore, the height of the first protrusions 261 can be defined without taking account of the height of the second protrusions 262. Namely, the height of the first protrusion 261 is the distance between a highest position and a lowest position of a first protrusion 261 in a direction orthogonal to the in-plane direction, i.e., in the up and down direction in FIG. 4A and FIG. 4B of an imaginary cross-sectional curve (see dotted line in FIG. 4A and FIG. 4B) of the first protrusion 261, with the second protrusions 262 smoothed out.

The height of the second protrusion 262 is the distance between a highest position and a lowest position of a second protrusion 262 in a direction orthogonal to a horizontal line when the imaginary cross-sectional curve of the first protrusion 261 described above is extended to be horizontal. The width of the second protrusion 262 is the distance between two adjacent lowest positions of second protrusions 262 in a direction orthogonal to the direction in which the height of the second protrusions 262 is defined.

Manufacturing Method of the Structure of the First Embodiment

The electronic device 1 having the structure described above can be produced as follows. Description of manufacturing processes of the detailed features mentioned above that are commonly provided to the electronic device 1 will be omitted.

First, part of one metal surface of the support member 2, i.e., regions outside the non-laser-irradiated region 27 in the in-plane direction is irradiated multiple times with a moving pulsed laser beam to form the rough surface 25 that has multiple laser irradiation marks 26 that are generally circular. The conditions of the laser beam irradiation are as follows. An Nd:YAG laser may be used, for example, as the laser light source. "Nd:YAG" is the acronym of "neodymium-doped yttrium aluminum garnet". With the Nd:YAG laser, a basic wavelength of 1064 µm, or a harmonic of 533 µm or 355 µm can be used. The spot diameter of the projected laser beam is 5 µm to 300 µm. The energy density is 5 J/cm2 to 100 J/cm2, and the pulse width, i.e., irradiation time per one spot, is 10 ns to 1000 ns.

Figure 5:
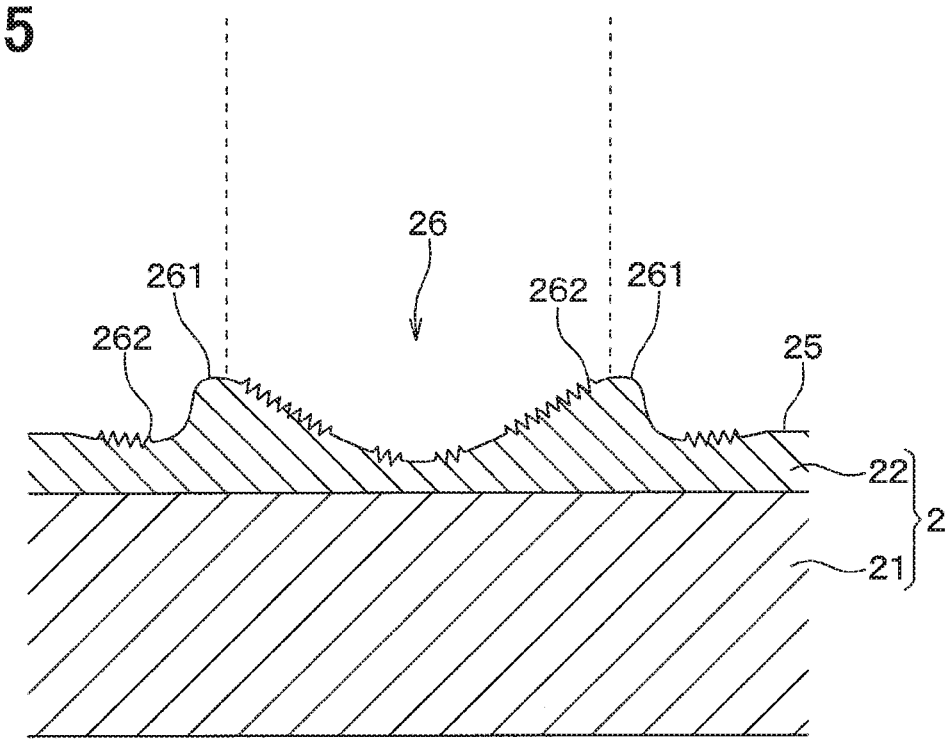
FIG. 5 is a partially enlarged cross-sectional view of the support member in a manufacturing step of the electronic device shown in FIG. 1.

FIG. 5 shows one laser irradiation mark 26 that has just been formed by one emission of a laser beam. The broken line in the drawing represents the laser beam. The laser beam irradiation induces melting and/or vaporization of the metal, as well as concurrent solidification and/or deposition of the metal. As a result, first protrusions 261 of a microscopic size are formed in a generally circular shape as viewed in plan, as shown in FIG. 5. The outside diameter of the first protrusion 261 is slightly larger than the spot diameter of the projected laser beam. Also, second protrusions 262 of a nanoscopic or submicroscopic size are formed inside and around the first protrusions 261.

The conditions of the laser beam scanning are as follows. In the present embodiment, an X-Y stage for removably supporting the laser light source, optical system, and support member 2 is fixedly installed such that it is not readily moved. The support member 2 is mounted on the X-Y stage. The laser light source is driven in sync with the driving of the X-Y stage such that the laser beam is projected to a desired position on the mounting surface 20. This way, the laser beam can be moved in a desired pattern on the mounting surface 20. In the following description, for ease of explanation, phrases that imply as though the laser beam would move on the mounting surface 20 may be used.

Figure 6:
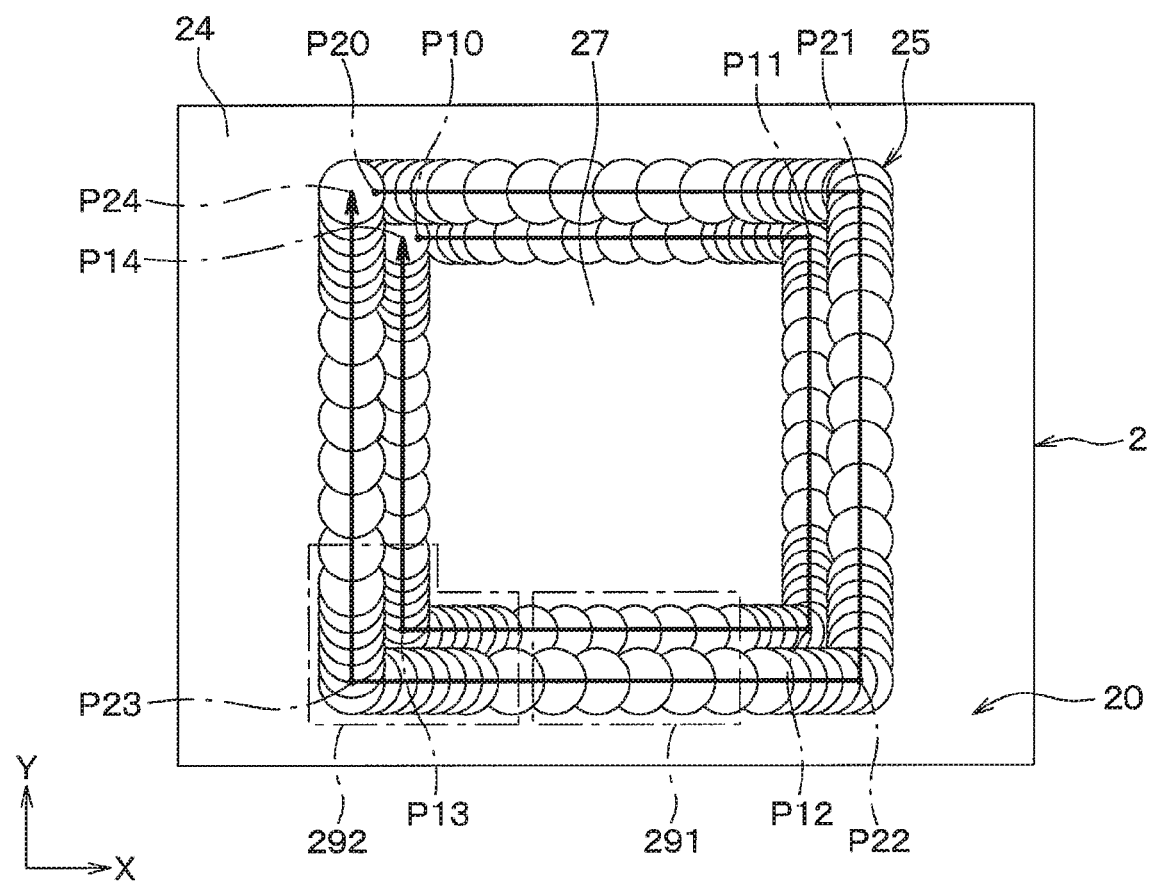
FIG. 6 is a plan view of the support member in a manufacturing step of the electronic device shown in FIG. 1.

In the present embodiment, as shown in FIG. 6, the laser beam is moved, starting from position P10, on the rectangular shape P11-P12-P13-P14. Thus, laser irradiation marks 26 are continuously formed on the rectangular shape P11-P12-P13-P14. Position P10 is located at a point displaced from position P14 on the side P14-P11 in the positive direction of X-axis in the drawing by about ½ of the spot diameter of the projected laser beam.

More specifically, first, the support member 2 is moved in the negative direction of X-axis in the drawing so that the mounting surface 20 is scanned by the laser beam straight from position P10 to position P11 in the positive direction of X-axis in the drawing. Next, the support member 2 is moved in the positive direction of Y-axis in the drawing so that the mounting surface 20 is scanned by the laser beam straight from position P11 to position P12 in the negative direction of Y-axis in the drawing. Successively, the support member 2 is moved in the positive direction of X-axis in the drawing so that the mounting surface 20 is scanned by the laser beam straight from position P12 to position P13 in the negative direction of X-axis in the drawing. Further, the support member 2 is moved in the negative direction of Y-axis in the drawing so that the mounting surface 20 is scanned by the laser beam straight from position P13 to position P14 in the positive direction of Y-axis in the drawing.

After that, the laser beam is moved, starting from position P20, on the rectangular shape P21-P22-P23-P24. Thus, laser irradiation marks 26 are successively formed on the rectangular shape P21-P22-P23-P24. The rectangular shape P21-P22-P23-P24 is positioned outside the rectangular shape P11-P12-P13-P14 by one laser beam spot. The side P21-P22 is adjacent to the side P11-P12, the side P22-P23 is adjacent to the side P12-P13, the side P23-P24 is adjacent to the side P13-P14, and the side P24-P21 is adjacent to the side P14-P11. Position P20 is located at a point displaced from position P24 on the side P24-P21 in the positive direction of X-axis in the drawing by about ½ of the spot diameter of the projected laser beam.

More specifically, first, the laser beam is moved straight from position P20 to position P21 in the positive direction of X-axis in the drawing. Next, the laser beam is moved straight from position P21 to position P22 in the negative direction of Y-axis in the drawing. Successively, the laser beam is moved straight from position P22 to position P23 in the negative direction of X-axis in the drawing. Further, the laser beam is moved straight from position P23 to position P24 in the positive direction of Y-axis in the drawing.

The speed of moving the laser beam, starting from position P10 and reaching P14 via P11, P12, and P13, is not constant. More specifically, the support member 2 is stopped before the projection of laser beam at position P10. The movement of the support member 2 in the negative direction of X-axis in the drawing is started with or immediately before the projection of laser beam at position P10. After that, the support member 2 is continuously moved until the projected laser beam point reaches position P11.

For a predetermined acceleration time after the support member 2 is started to move, the moving speed of the support member 2 is increased, after which the moving speed is made constant. After that, the moving speed of the support member 2 is decreased, and the movement of the support member 2 in the negative direction of X-axis in the drawing is stopped with or immediately after the projection of laser beam at position P11 for changing the moving direction of the support member 2. Therefore, the scanning speed becomes relatively slow near position P10 immediately after the start of scanning, and near position P11 immediately before the end of scanning. Accordingly, the density of the laser irradiation marks 26 is relatively high near position P10 and near position P11. In comparison, the scanning speed is relatively high around an intermediate position between P10 and P11, as a result of which the density of the laser irradiation marks 26 is relatively low there.

At position P11, the moving direction of the support member 2 is changed. Namely, the support member 2 travels in the positive direction of Y-axis in the drawing for the laser beam to move from position P11 to P12. Once the support member 2 starts moving in the positive direction of Y-axis in the drawing, the support member 2 continuously moves until the projected laser beam point reaches position P12. As with the scanning between positions P10-P11 described above, the scanning speed becomes relatively slow near position P11 immediately after the start of scanning, and near position P12 immediately before the end of scanning. Accordingly, the density of the laser irradiation marks 26 is relatively high near position P11 and near position P12. In comparison, the scanning speed is relatively high in the intermediate position between P11 and P12, as a result of which the density of the laser irradiation marks 26 is relatively low there.

The same applies to the movement of the laser beam from position P12 to P13, and the movement from position P13 to P14. Thus, the density of the laser irradiation marks 26 becomes relatively high at the corners of the rectangular shape P11-P12-P13-P14. In comparison, the density of the laser irradiation marks 26 becomes relatively low around intermediate positions on each side of the rectangular shape P11-P12-P13-P14.

The scanning with the laser beam starting from position P20 and reaching P24 via P21, P22, and P23 is carried out similarly to the scanning with the laser beam described above starting from position P10 and reaching P14 via P11, P12, and P13. Thus, the density of the laser irradiation marks 26 becomes relatively high at the corners of the rectangular shape P21-P22-P23-P24. In comparison, the density of the laser irradiation marks 26 becomes relatively low around intermediate positions on each side of the rectangular shape P21-P22-P23-P24, In this way, second regions 292 having a higher density of laser irradiation marks 26 in the in-plane direction than that of first regions 291 are formed at the corners of the rectangular planar shape of the rough surface 25.

In the second regions 292 having a higher density of laser irradiation marks 26 than that of the first regions 291, the amount of vaporization and deposition of metal caused by laser beam irradiation is relatively high. Therefore, the second protrusions 262 in the second region 292 are formed higher than the second protrusions 262 in the first region 291.

After the rough surface 25 is formed on the mounting surface 20 by laser beam irradiation as described above, the conductive bonding layer 4 is joined to the placement surface 23 including the non-laser-irradiated region 27. Successively, the electronic component 3 is joined to the conductive bonding layer 4 on the opposite side from the side joined to the mounting surface 20. Thus, the electronic component 3 is mounted on the support member 2 via the conductive bonding layer 4.

After that, the resin member 5, which is a synthetic resin molded article, is joined to the sealing surface 24, whereby the resin member 5 covers the electronic component 3. At this time, the rough surface 25 has been formed on the sealing surface 24. The rough surface 25 includes, when viewed microscopically, first protrusions 261 of a microscopic size and second protrusions 262 of a nanoscopic or submicroscopic size, as shown in FIG. 4A and FIG. 4B. Therefore, the support member 2 and the resin member 5 form a favorable bond with each other.

(Effects of First Embodiment)

As described above, in the present embodiment, the support member 2 is irradiated with a laser beam to form the rough surface 25 of multiple laser irradiation marks 26 on the sealing surface 24 of the support member 2. The rough surface 25, provided for enhancing the joint (bond) with the resin member 5, includes first regions 291, and second regions 292 having a higher density of laser irradiation marks 26 in the in-plane direction than that of the first regions 291.

The second regions 292 having a high density of laser irradiation marks 26 can be provided to desired areas as required. More specifically, the second regions 292 having a high density of laser irradiation marks 26 are provided, for example, in areas near four corners of the rectangular shape of the electronic component 3, which are portions of the joint between the support member 2 and the conductive bonding layer 4 and resin member 5 where internal stress is high. Therefore, the possibility of failures such as peeling of the resin member 5 and the like resulting from internal stress is reduced as much as possible. This means that the bond between the sealing surface 24 that is the surface of a metallic nature of the support member 2 and the resin member 5 is enhanced even more.

In the second regions 292 having a high density of laser irradiation marks 26, the second protrusions 262 are formed higher than those in the first regions 291 having a low density of laser irradiation marks 26. Accordingly, the bond with the resin member 5 is improved even more in portions where internal stress is high.

In the present embodiment, the second regions 292 having a high density of laser irradiation marks 26 are not provided to the entire rough surface 25 but only to necessary parts. More specifically, the second region 292 is selectively formed near a starting point and near an end point of a unidirectional travel of the laser beam on the mounting surface 20. According to the present embodiment, a favorable bond can be secured while an increase in processing time is minimized.

Structure of Second Embodiment

Figure 11:
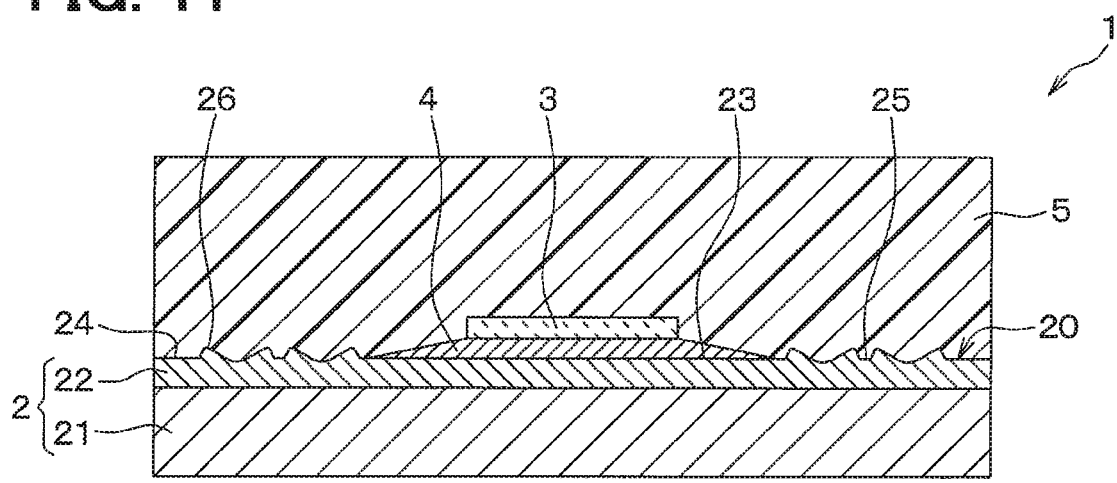
FIG. 11 is a cross-sectional view illustrating a schematic configuration of an electronic device of a second embodiment.
Figure 12:
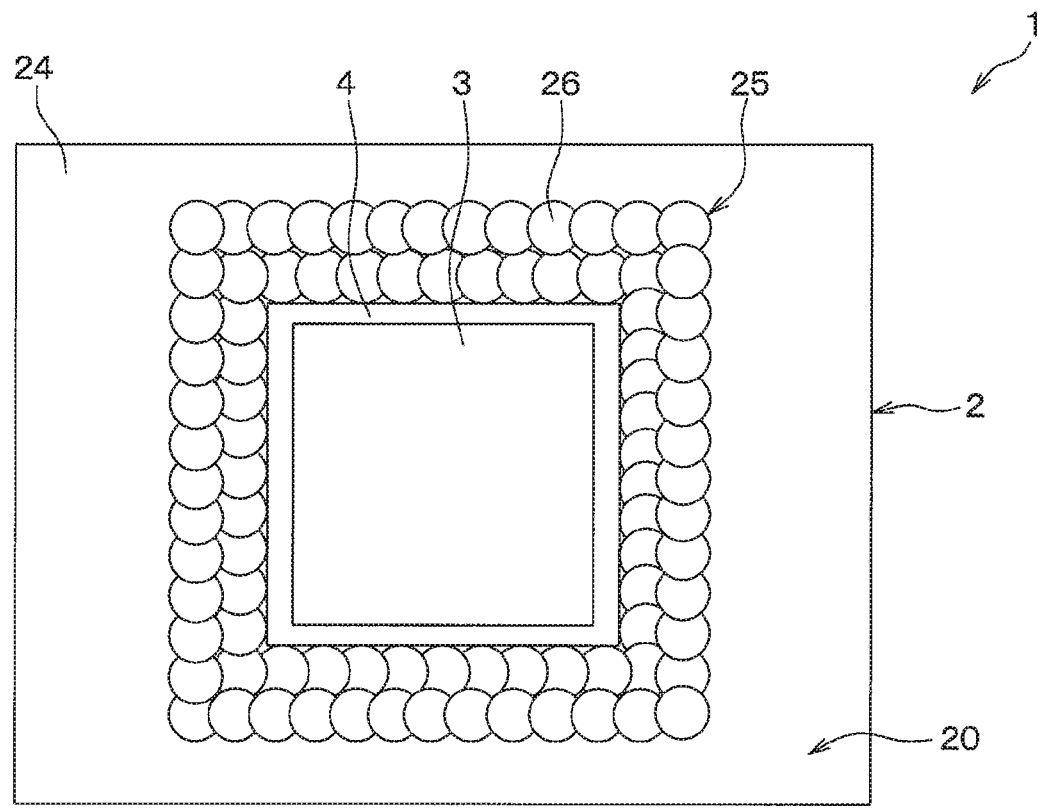
FIG. 12 is a plan view of the electronic device shown in FIG. 11.

The structure of an electronic device 1 of the present embodiment will be described with reference to FIG. 11 to FIG. 14. As shown in FIG. 11, the electronic device 1 includes a support member 2, an electronic component 3, a conductive bonding layer 4, and a resin member 5.

The support member 2 has a main body 21 and a metallized layer 22. In the present embodiment, the metallized layer 22 is made of a film of a metal material (e.g., nickel-based metal) with a good wettability for the material forming the conductive bonding layer 4, formed by plating or the like.

A mounting surface 20 is formed on part of one planar metal surface of the support member 2 by performing a laser beam irradiation treatment for enhancing the joint (i.e., bond) with the conductive bonding layer 4 and resin member 5. More specifically, the mounting surface 20 includes a placement surface 23 and a sealing surface 24. Namely, the metallized layer 22 includes the placement surface 23 and sealing surface 24.

The sealing surface 24 includes a rough surface 25. The rough surface 25 is formed by a plurality of laser irradiation marks 26 that are generally circular. The laser beam for forming the rough surface 25 may be referred to as "surface roughening beam" below.

The placement surface 23 includes a boundary area 231. The boundary area 231 is irradiated with a post-processing beam that is a laser beam with a lower energy level than that of the surface roughening beam. In this way, the boundary area 231 is formed for an improved wettability for the material forming the conductive bonding layer 4 than that of the rough surface 25 of the sealing surface 24. The boundary area 231 is a band-like portion in a generally rectangular shape when viewed in plan adjoining the sealing surface 24 in the in-plane direction of the placement surface 23. More specifically, the boundary area 231 is provided on an outer edge of the non-laser-irradiated region 27. In this way, the placement surface 23 is formed as a surface of a metallic nature with a good wettability for the material forming the conductive bonding layer 4 as a whole.

Figure 13:
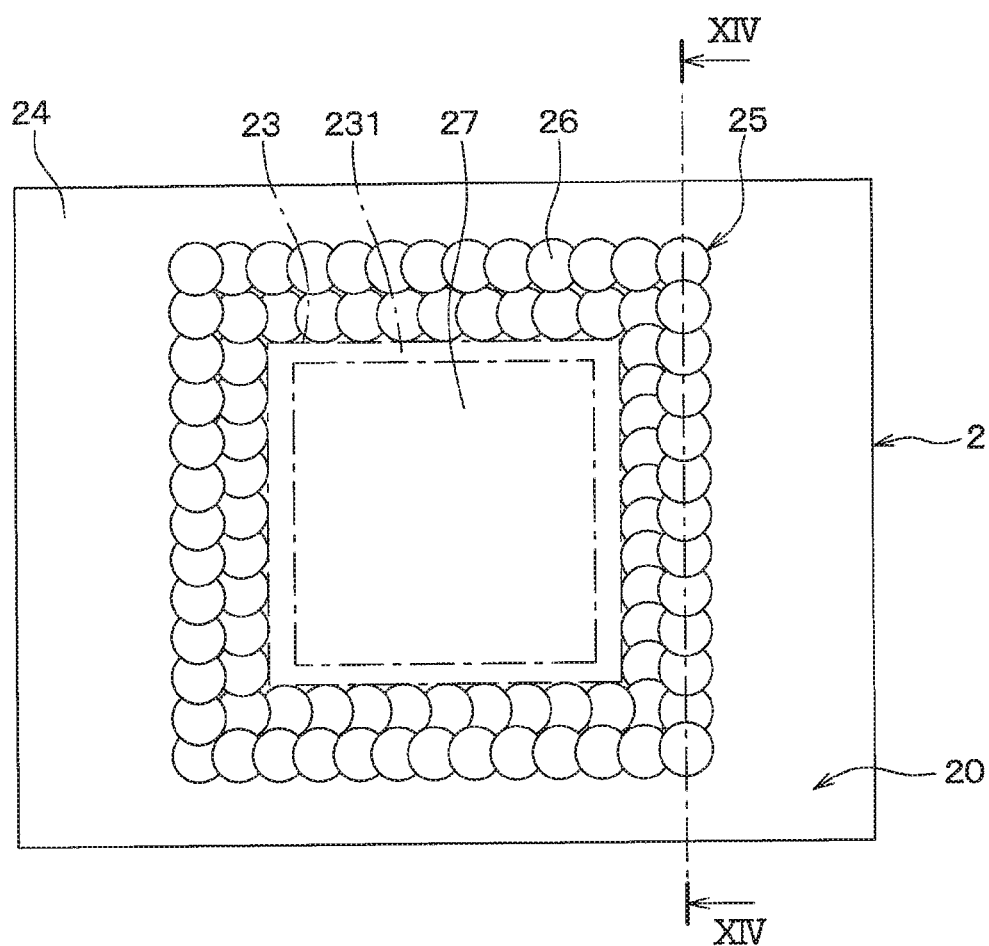
FIG. 13 is a plan view of a support member shown in FIG. 11.
Figure 14:
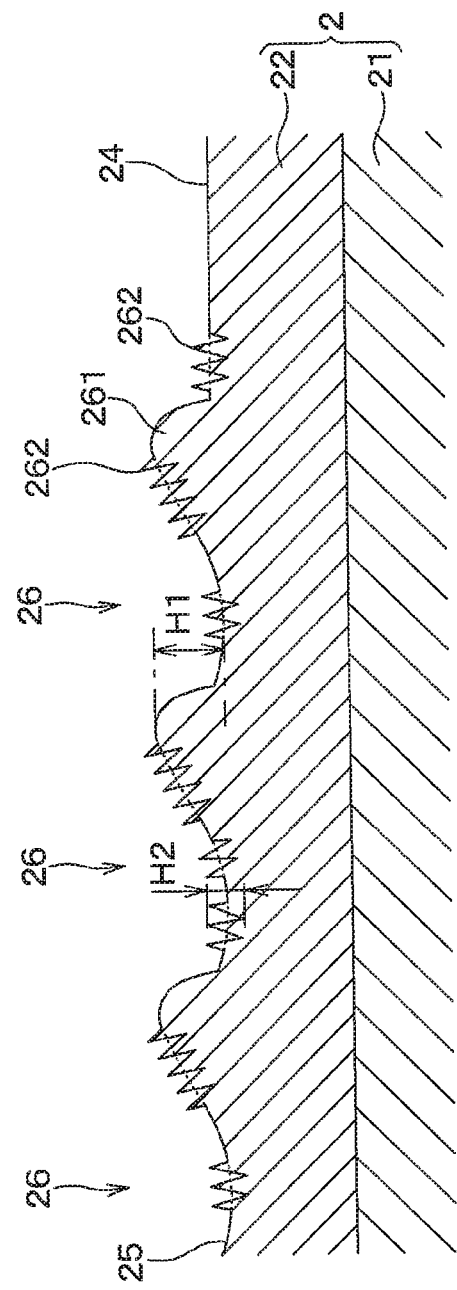
FIG. 14 is a partially enlarged cross-sectional view of the support member shown in FIG. 11.

FIG. 14 shows a portion of the XIV-XIV section of FIG. 13. As shown in FIG. 14, a plurality of first protrusions 261 and a plurality of second protrusions 262 are formed on the rough surface 25.

(Manufacturing Method and Effects)

The electronic device 1 having the structure described above can be produced as follows. Description of manufacturing processes of the detailed features mentioned above that are commonly provided to the electronic device 1 will be omitted.

First, part of one metal surface of the support member 2, i.e., regions on the outer side in the in-plane direction of the non-laser-irradiated region 27 is irradiated multiple times with a moving pulsed surface roughening beam to form the rough surface 25 that has multiple laser irradiation marks 26 that are generally circular. The conditions of the surface roughening beam irradiation are as follows. An Nd:YAG laser may be used, for example, as the laser light source. With the Nd:YAG laser, a basic wavelength of 1064 μm, or a harmonic of 533 μm or 355 μm can be used. The projected beam spot has a diameter of 5 μm to 300 μm. The energy density is 5 J/cm2 to 100 J/cm2, and the pulse width, i.e., irradiation time per one spot, is 10 ns to 1000 ns.

Figure 15:
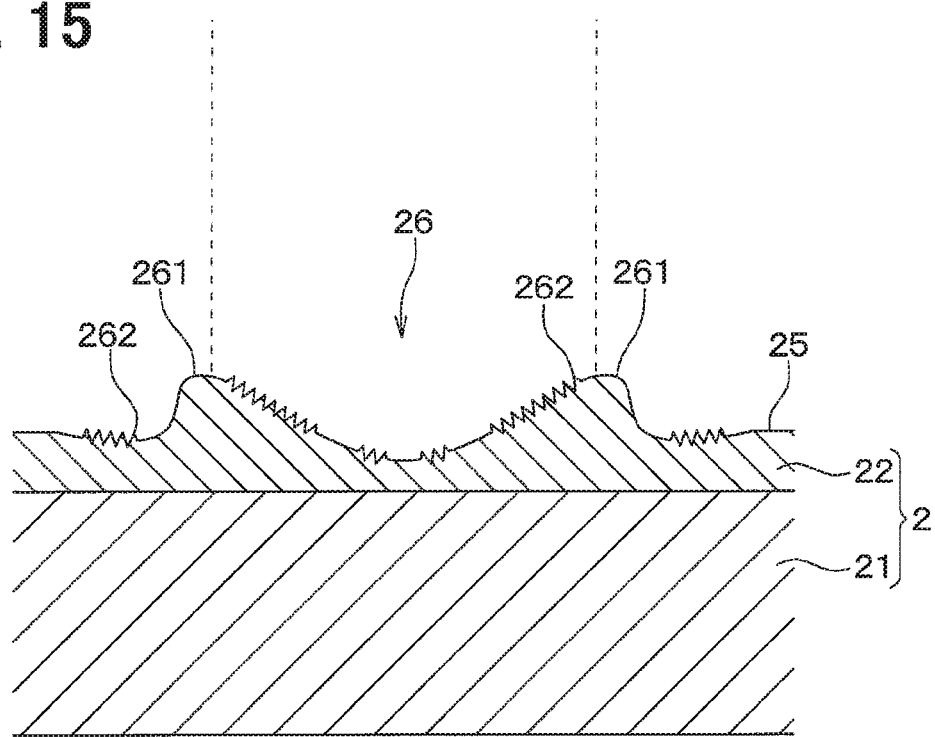
FIG. 15 is a partially enlarged cross-sectional view of the support member in a manufacturing step of the electronic device shown in FIG. 11.

FIG. 15 shows one laser irradiation mark 26 that has just been formed by projection of one spot of the surface roughening beam. The broken line in the drawing represents the surface roughening beam. The projection of the surface roughening beam induces melting and/or vaporization of the metal, as well as concurrent solidification and/or deposition of the metal. As a result, first protrusions 261 of a microscopic size are formed in a generally circular shape as viewed in plan, as shown in FIG. 15. The outside diameter of the first protrusion 261 is slightly larger than the spot diameter of the projected surface roughening beam. Also, second protrusions 262 of a nanoscopic or submicroscopic size are formed inside and around the first protrusions 261.

The scanning with the surface roughening beam and the post-processing beam to be described later is performed as follows. In the present embodiment, an X-Y stage for removably supporting the laser light source, optical system, and support member 2 is fixedly installed such that it is not readily moved. The support member 2 is mounted on the X-Y stage. The laser light source is driven in sync with the driving of the X-Y stage such that the laser beam is projected to a desired position on the mounting surface 20. This way, the laser beam can be moved in a desired pattern on the mounting surface 20. In the following description, for ease of explanation, phrases that imply as though the laser beam would move on the mounting surface 20 may be used.

Figure 16:
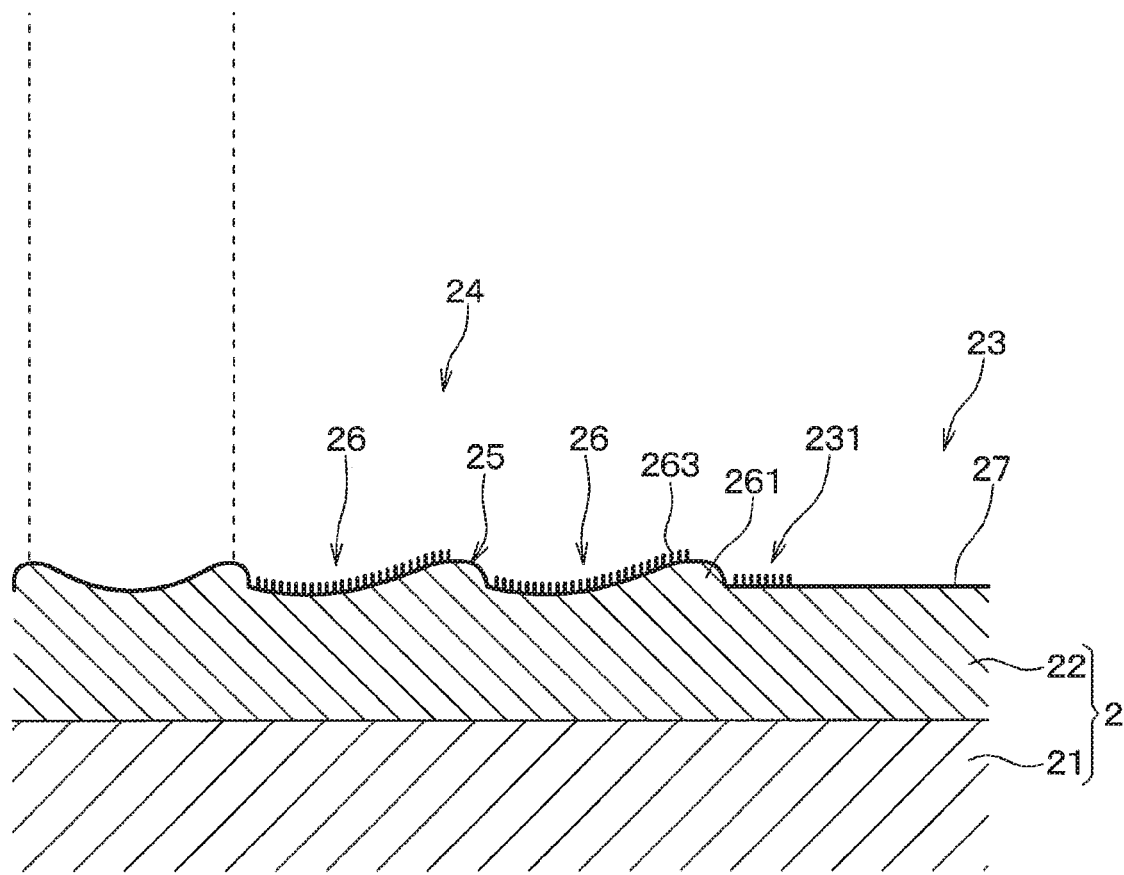
FIG. 16 is a partially enlarged cross-sectional view of the support member in a manufacturing step of the electronic device shown in FIG. 11.

FIG. 16 shows how a plurality of laser irradiation marks 26 are successively formed by the surface roughening beam travelling toward the left in the drawing. For simplification of illustration and description, second protrusions 262 (see FIG. 15) in the rough surface 25 are not shown in FIG. 16.

As shown in FIG. 16, the support member 2 is irradiated and scanned with the surface roughening beam to form the rough surface 25 of a plurality of laser irradiation marks 26 on the sealing surface 24 of the support member 2. A non-laser-irradiated region 27 is formed closer to a central part in the in-plane direction of the support member 2. Namely, the sealing surface 24 is formed on the outer side in the in-plane direction of the non-laser-irradiated region 27.

When the plurality of laser irradiation marks 26 are formed by projection of the surface roughening beam, deposits 263 accumulate inside and around each of the laser irradiation marks 26. The deposits 263 are composed of the metal that forms the metallized layer 22, compounds and the like (i.e., typically oxides) of the metal. Accumulation and the like of these deposits 263 create minute irregularities inside and around the laser irradiation marks 26. Namely, the deposits 263 are one factor that causes formation of the second protrusions 262 shown in FIG. 15.

Accumulation of deposits 263 and concurrent formation of minute irregularities may also occur in the boundary area 231 that adjoins the sealing surface 24 in the in-plane direction of the placement surface 23. If this is the case, there is a risk that wettability of the material forming the conductive bonding layer 4 may be deteriorated in the boundary area 231 due to the influence of the compounds and the like mentioned above. If plating of a nickel-based metal that has a good wettability for solder is used as the metallized layer 22, in particular, deposits 263 that are nickel oxides largely deteriorates the wettability for solder. Providing a margin area with a predetermined width between the placement surface 23 and the rough surface 25 in consideration of such wettability deterioration in the boundary area 231 leads to an increase in size of the electronic device 1.

Internal stresses such as heat stress can readily arise near corner parts of the planar shape of the electronic component 3 that is rectangular. In this respect, the deteriorated wettability in the boundary area 231 and/or formation of a margin area as noted above may weaken the bond between the support member 2 and the conductive bonding layer 4 and resin member 5 near the corner parts of the electronic component 3. There is thus a risk of peeling and/or crack formation occurring in the conductive bonding layer 4 near the corner parts of the electronic component 3.

Figure 17:
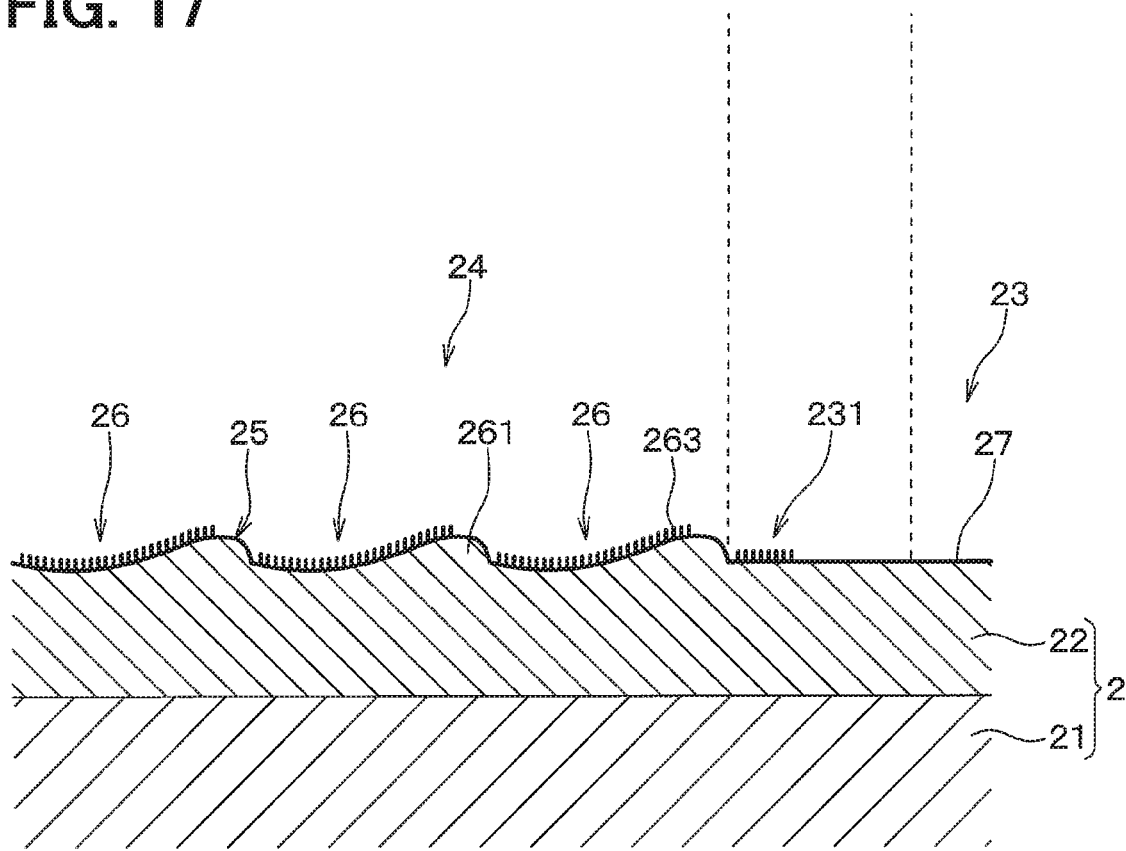
FIG. 17 is a partially enlarged cross-sectional view of the support member in a manufacturing step of the electronic device shown in FIG. 11.

In the present embodiment, as shown in FIG. 17, the boundary area 231 is irradiated with a post-processing beam. Post-processing beam irradiation is carried out using the same laser irradiation equipment as that for the surface roughening beam irradiation, after the surface roughening beam irradiation is finished. The laser irradiation equipment includes a laser light source, an optical system, an X-Y stage, and a controller or the like for these components. Therefore, once the support member 2 is mounted on the X-Y stage, the support member 2 is not removed from the X-Y stage until irradiation with the surface roughening beam and irradiation with the post-processing beam thereafter are completed.

The conditions of the post-processing beam irradiation are as follows. The same parameters as those of the surface roughening beam may be used for the wavelength, projected beam spot diameter, and pulse width of the post-processing beam. The energy density is 0.5 J/cm$^2$ to 3 J/cm$^2$. To improve the wettability even more, the irradiation pitch, i.e., the distance between centers of two successive spots, is set shorter than that of the surface roughening beam. More specifically, when the spot diameter and the irradiation pitch of the surface roughening beam are set 80 μm and 70 μm, respectively, the spot diameter and the irradiation pitch of the post-processing beam may be set 80 μm and not more than 35 μm, respectively.

Figure 18:
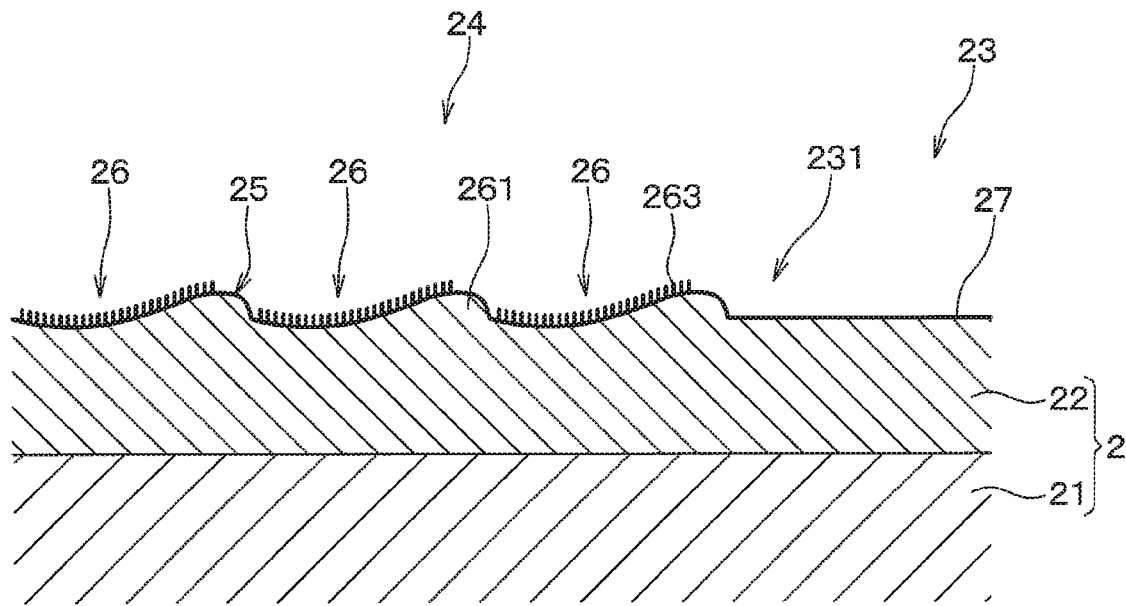
FIG. 18 is a partially enlarged cross-sectional view of the support member in a manufacturing step of the electronic device shown in FIG. 11.

Irradiation with the post-processing beam favorably removes the compounds and the like mentioned above, which are one cause of deterioration of wettability for the material forming the conductive bonding layer 4, from the boundary area 231, as shown in FIG. 18. Thus, the wettability for the material forming the conductive bonding layer 4 is made improved in the boundary area 231 than on the rough surface 25 of the sealing surface 24.

In this way, the boundary area 231 is irradiated with the post-processing beam after the rough surface 25 has been formed on the mounting surface 20 by projection of the surface roughening beam. Thus, the placement surface 23, which is a surface of a metallic nature joined to the conductive bonding layer 4 and includes the boundary area 231 and the non-laser-irradiated region 27, is formed on the support member 2. Projection of the surface roughening beam and projection of the post-processing beam thereafter are carried out continuously using the same laser irradiation equipment without performing removal and attachment operations of the support member 2 in between. Therefore, the placement surface 23 having a favorable wettability for the material forming the conductive bonding layer 4 can be formed swiftly with a good positional precision.

Figure 19:
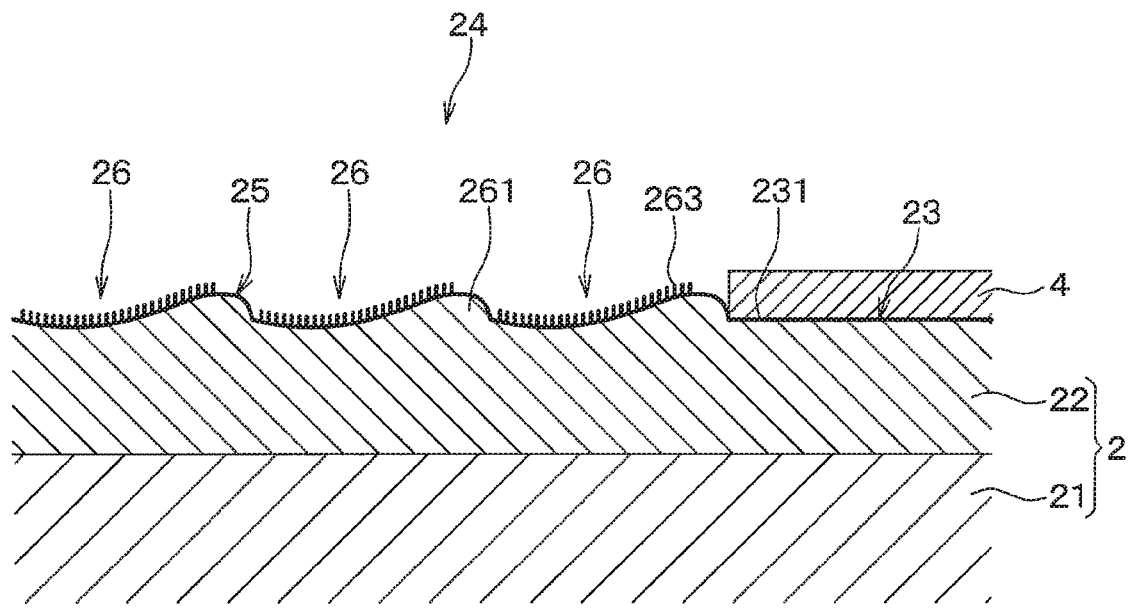
FIG. 19 is a partially enlarged cross-sectional view of the support member and others in a manufacturing step of the electronic device shown in FIG. 11.
Figure 20:
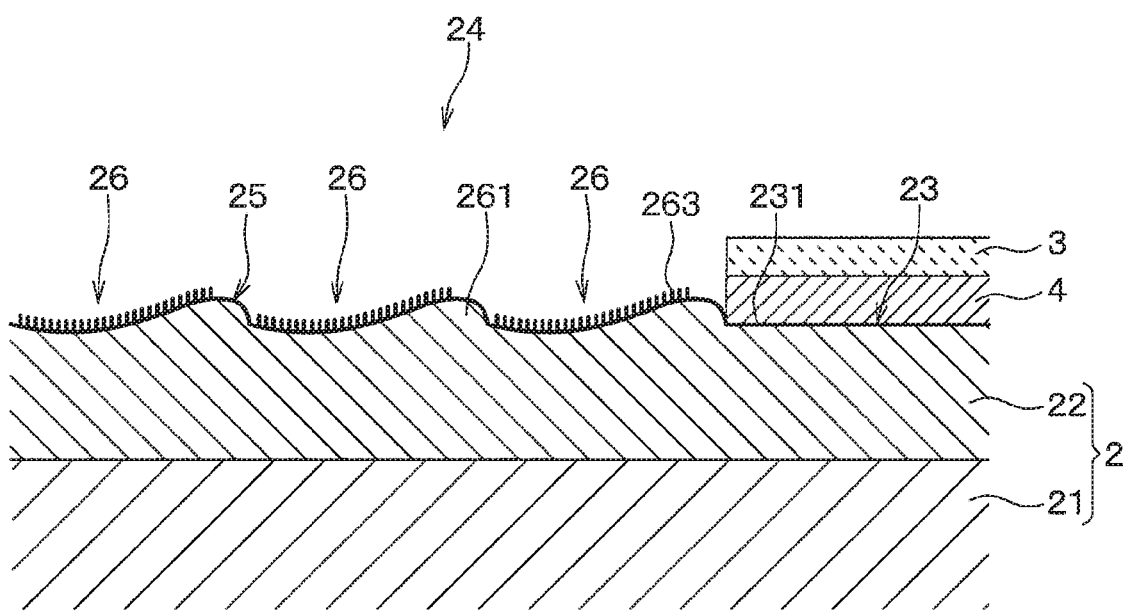
FIG. 20 is a partially enlarged cross-sectional view of the support member and others in a manufacturing step of the electronic device shown in FIG. 11.

After that, the conductive bonding layer 4 is formed on the placement surface 23 by coating or the like, as shown in FIG. 19. Successively, as shown in FIG. 20, the electronic component 3 is joined to the conductive bonding layer 4 on the opposite side from the side joined to the mounting surface 20. Thus, the electronic component 3 is mounted on the support member 2 via the conductive bonding layer 4.

As described above, the wettability for the material forming the conductive bonding layer 4 is made improved in the boundary area 231 on the placement surface 23 than on the rough surface 25 of the sealing surface 24. Therefore, the bond with the conductive bonding layer 4 on the placement surface 23 can be secured favorably.

Figure 21:
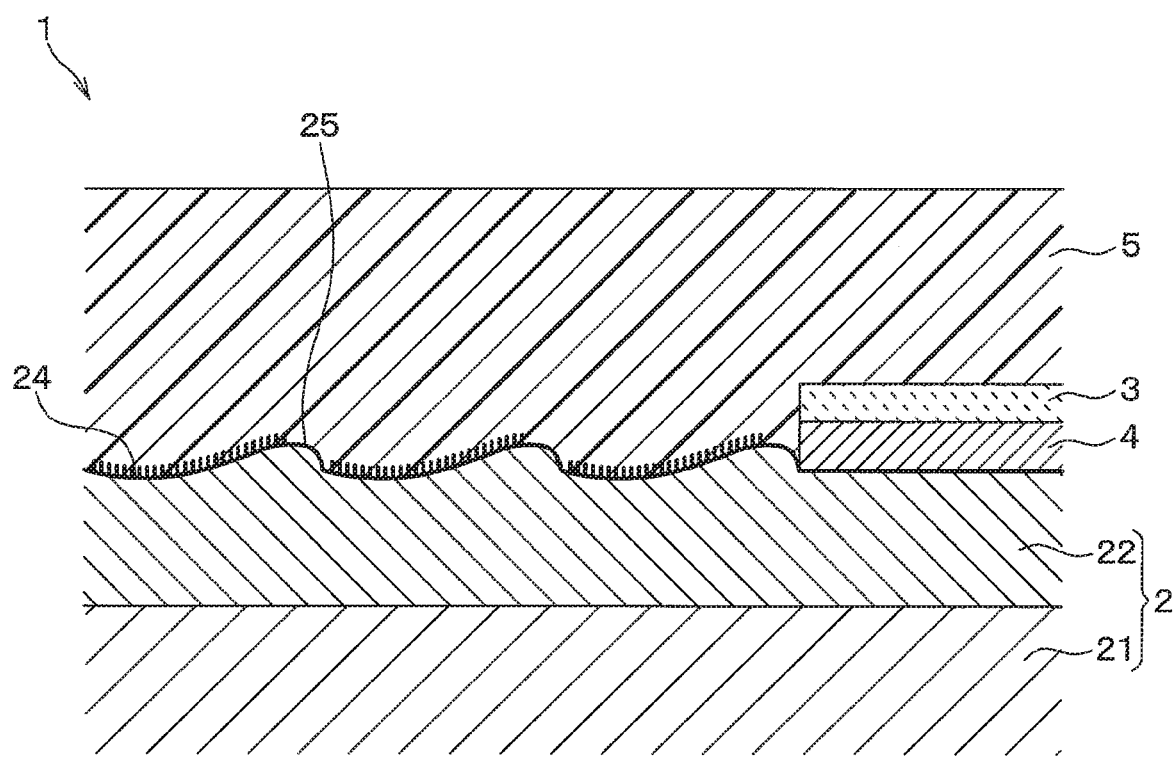
FIG. 21 is a partially enlarged cross-sectional view of the electronic device in a manufacturing step of the electronic device shown in FIG. 11.

After that, as shown in FIG. 21, the resin member 5, which is a synthetic resin molded article, is joined to the sealing surface 24 to cover the electronic component 3 with the resin member 5, and thus the electronic device 1 is produced. At this time, the rough surface 25 has been formed on the sealing surface 24. The rough surface 25 includes, when viewed microscopically, first protrusions 261 of a microscopic size and second protrusions 262 of a nanoscopic or submicroscopic size, as shown in FIG. 14. Therefore, the support member 2 and the resin member 5 form a favorable bond with each other by the anchoring effect.

As described above, in the present embodiment, a good bond with the conductive bonding layer 4 on the placement surface 23 is secured, while a favorable bond is also realized between the sealing surface 24 and the resin member 5.

(Variation Examples)

The present disclosure is not limited to the embodiments described above. The following changes can be made as required to the embodiments described above. Typical variation examples will now be described below. In the following description of variation examples, only the features different from those of the embodiments described above will be explained. Therefore, descriptions of previous embodiments can be referred to as required with respect to constituent elements given the same reference numerals as those of the embodiments described above in the following description of variation examples, unless there are technical contradictions or otherwise additionally described.

The support member 2 is not limited to a lead frame. The support member 2 may be a so-called SOI substrate, for example. SOI is the acronym of "Silicon on Insulator". The support member 2 need not necessarily include the metallized layer 22 if the main body 21 is made of a metal material and its surface can form a reasonably good bond with the conductive bonding layer 4 and the resin member 5.

The electronic component 3 is not limited to an IC chip. For example, the electronic component 3 may be a capacitor device or the like.

Parts of the sealing surface 24 that are not provided with the rough surface 25 need not necessarily be covered by the resin member 5. Alternatively, the rough surface 25, or the plurality of laser irradiation marks 26, may be formed on the entire sealing surface 24 (see FIG. 7 to FIG. 9). Parts of the rough surface 25, i.e., an outer edge in the in-plane direction, need not necessarily be covered by the resin member 5.

Figure 7:
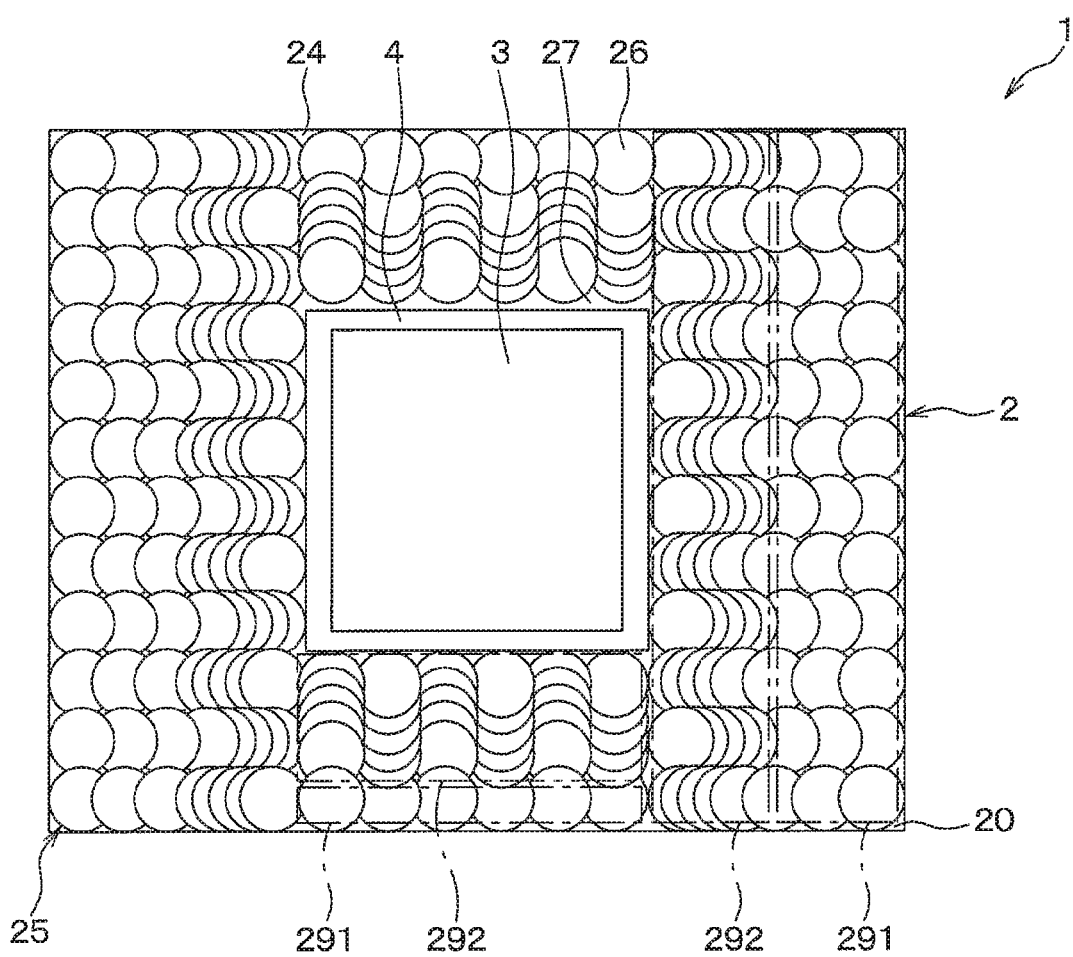
FIG. 7 is a plan view illustrating a schematic configuration of a variation example of the electronic device of the first embodiment.
Figure 8:
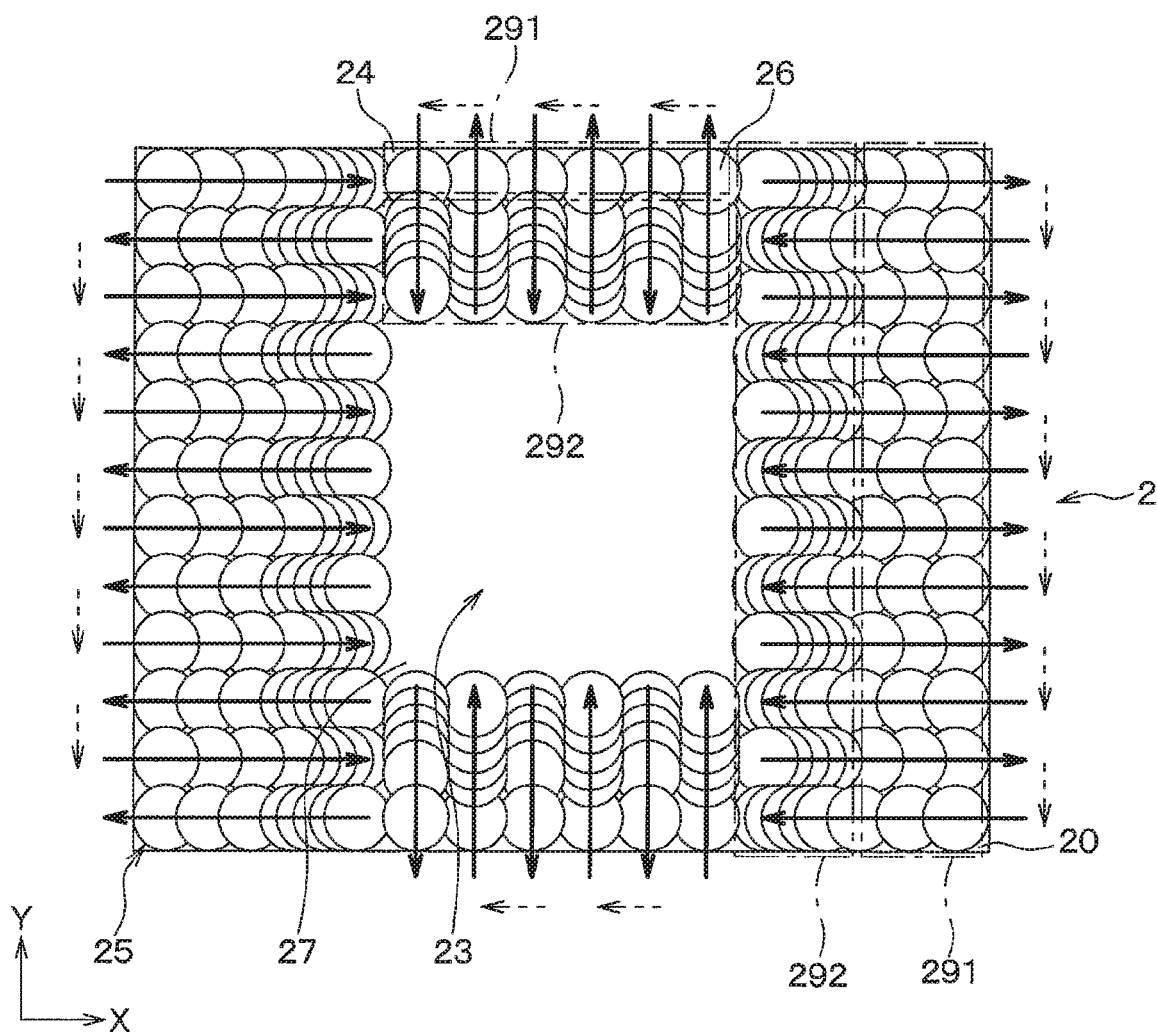
FIG. 8 is a plan view of the support member in a manufacturing step of the electronic device shown in FIG. 7.

As shown in FIG. 7, the second region 292 may be provided in areas near each side of the rectangular shape of the electronic component 3. The structure of the laser irradiation marks 26 in the example shown in FIG. 7 is the same as those of the embodiments described above (see FIG. 4A and FIG. 46).

The laser is not limited to the type used in the embodiments described above. For example, CO2 gas laser, excimer laser, and the like can be used.

The laser scanning method is not limited to the type used in the embodiments described above. Namely, for example, the support member 2 may be fixed, and the laser beam spot can be moved on the mounting surface 20, using an optical system.

There is no particular limitation to the laser beam moving directions. Namely, for example, as shown in FIG. 6, the laser beam can be moved along a closed curve. Alternatively, for example, as indicated by solid line arrows in FIG. 8, the laser beam can be reciprocated many times. More specifically, when the scanning is carried out in the manner shown in FIG. 8, the laser beam is not emitted during the relative movement of the support member 2 in the subscanning direction (see the broken line arrows in FIG. 8). The support member 2 is irradiated with the laser beam during the relative movement in the main scanning direction (see the solid line arrows in FIG. 8) that is performed between one run of scanning in the subscanning direction and a subsequent run of scanning in the subscanning direction. The direction of relative movement of the support member 2 in one run of scanning in the main scanning direction is opposite from that of a subsequent run of scanning in the main scanning direction.

Figure 9:
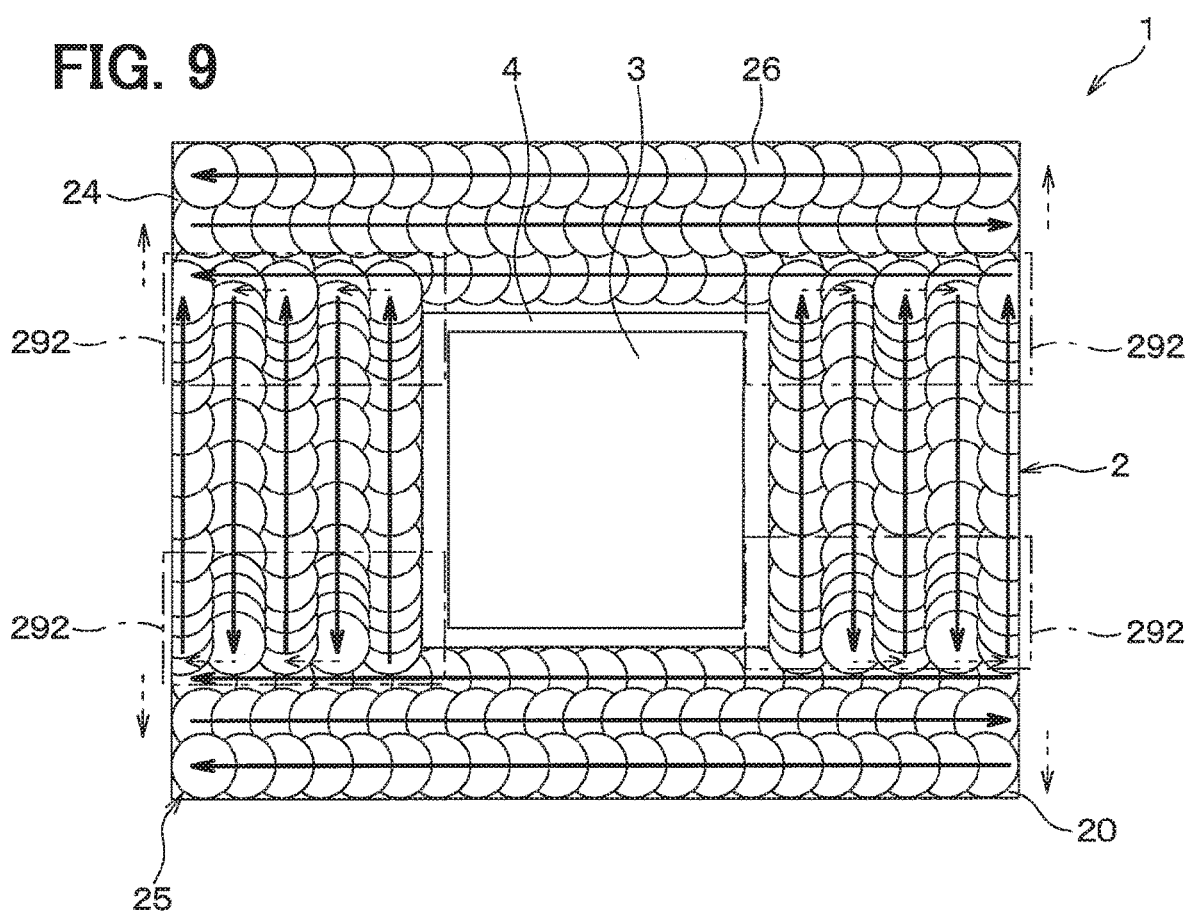
FIG. 9 is a plan view illustrating a schematic configuration of another variation example of the electronic device of the first embodiment.

As shown in FIG. 9, when the rough surface 25 is formed on the entire sealing surface 24, the second region 292 having a higher density of laser irradiation marks 26 may be provided correspondingly to portions of the joint between the support member 2 and the conductive bonding layer 4 and resin member 5 where internal stress is higher than other parts. Namely, the second region 292 may be formed in a band-like shape including areas near the four corners of the rectangular shape of the electronic component 3 and extending from these areas along one side (i.e., upper side in FIG. 9) of the outer shape that is rectangular when viewed in plan of the electronic component 3. The structure of the laser irradiation marks 26 in the example shown in FIG. 9 is also the same as those of the embodiments described above (see FIG. 4A and FIG. 4B).

When the scanning is carried out in the manner shown in FIG. 9, similarly, the laser beam is not emitted during the relative movement of the support member 2 in the subscanning direction (see the broken line arrows in FIG. 9). The support member 2 is irradiated with the laser beam during the relative movement in the main scanning direction (see the solid line arrows in FIG. 9) that is performed between one run of scanning in the subscanning direction and a subsequent run of scanning in the subscanning direction. The direction of relative movement of the support member 2 in one run of scanning in the main scanning direction is opposite from that of a subsequent run of scanning in the main scanning direction.

The second protrusions 262 need only be formed inside the first protrusions 261 or around the first protrusions 261.

The method of forming the second regions 292 having a higher density of laser irradiation marks 26 is not limited to the specific examples in the embodiments described above. Namely, the present disclosure is not limited to the methods described in the embodiments in which the density of the laser irradiation marks 26 is varied using changes in the speed of relative movements between the support member 2 and the optical system. More specifically, for example, the speed of the relative movement between the support member 2 and the optical system can be made constant while the laser beam spot passes through a region corresponding to the rough surface 25 on the mounting surface 20. In this case, the density of the laser irradiation marks 26 can be varied by adjusting the oscillation frequencies of the laser beam. Alternatively, the density of the laser irradiation marks 26 can be varied by controlling both the speed of relative movements between the support member 2 and the optical system, and the oscillation frequencies of the laser beam.

The manner in which the laser irradiation marks 26 are formed in the first regions 291 and second regions 292 is not limited to the specific examples in the embodiments described above. For example, some parts of the first region 291 may not have the laser irradiation marks 26. The density of the laser irradiation marks 26 formed in the second region 292 may be constant, or, the second region 292 may have specific areas where the formation density is particularly high.

Figure 10:
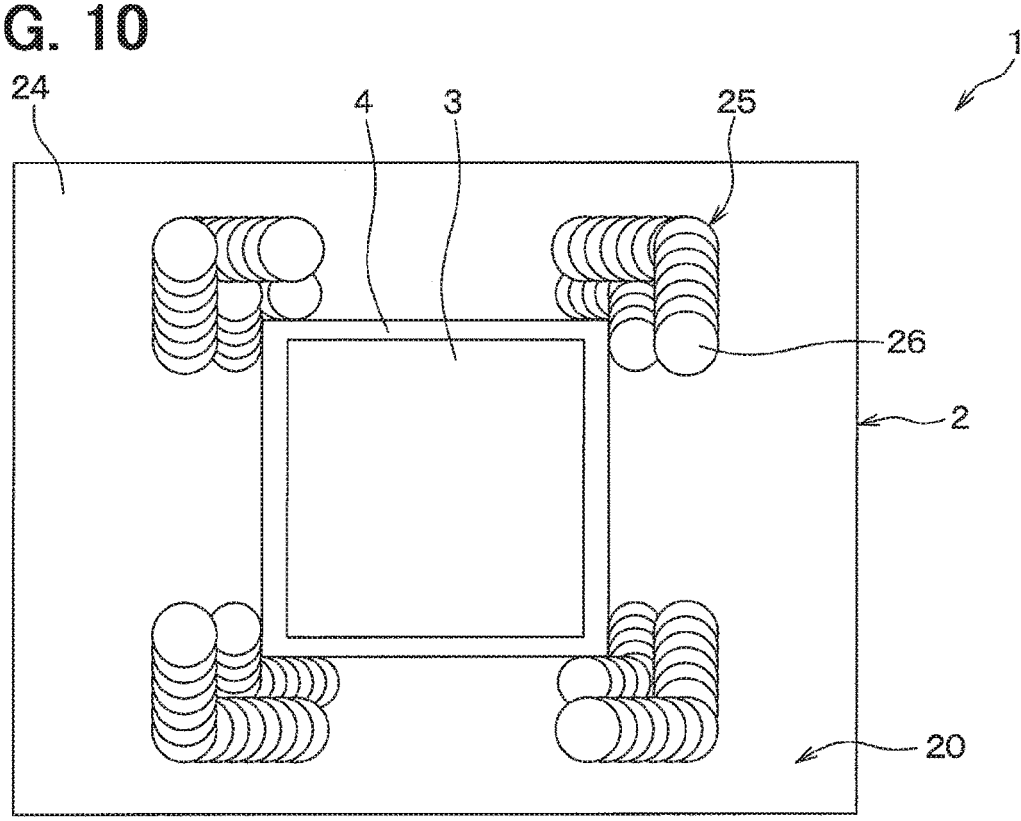
FIG. 10 is a plan view illustrating a schematic configuration of yet another variation example of the electronic device of the first embodiment.

As shown in FIG. 10, the rough surface 25 may be provided only in areas corresponding to portions of the joint between the support member 2 and the conductive bonding layer 4 and resin member 5 where internal stress is higher than other parts. More specifically, the rough surface 25 may be provided in areas near four corners of the rectangular shape of the electronic component 3. The structure of the laser irradiation marks 26 in the example shown in FIG. 10 is also the same as those of the embodiments described above (see FIG. 4A and FIG. 4B). The same effects as those of the embodiments described above can be achieved with this structure, too.

The formation of the conductive bonding layer 4 on the placement surface 23 shown in FIG. 19 and the placement of the electronic component 3 on the placement surface 23 shown in FIG. 20 can be carried out simultaneously.

The irradiation conditions, i.e., wavelengths, projected beam spot diameters, pulse widths, and so on, of the surface roughening beam and the post-processing beam may be different from each other. For example, the wavelength of the post-processing beam can be set to a short wavelength (i.e., ultraviolet wavelength, for example) from the viewpoint of oxide removal. More specifically, a basic wavelength of 1064 µm can be used for the surface roughening beam, and a third harmonic of 355 µm can be used for the post-processing beam, when using the Nd:YAG laser. In this case, projection of the post-processing beam having an ultraviolet wavelength removes the oxide or the like by ablation that does not involve a thermal process. Thus, removal of oxides and the like is made possible with minimum thermal effects to the surrounding area. The post-processing beam may be emitted continuously instead of being emitted in pulses.

Different types of laser may be used for the surface roughening beam and the post-processing beam. For example, a long-wavelength laser can be used suitably for the surface roughening beam, whereby melting of metal readily occurs due to a thermal process. On the other hand, a short-wavelength laser such as excimer laser can be used suitably for the post-processing beam, for removal of oxides or the like with minimum thermal effects to the surrounding area as mentioned above.

The support member 2 may be removed and attached between the irradiation with the surface roughening beam and the irradiation with the post-processing beam.

Figure 22:
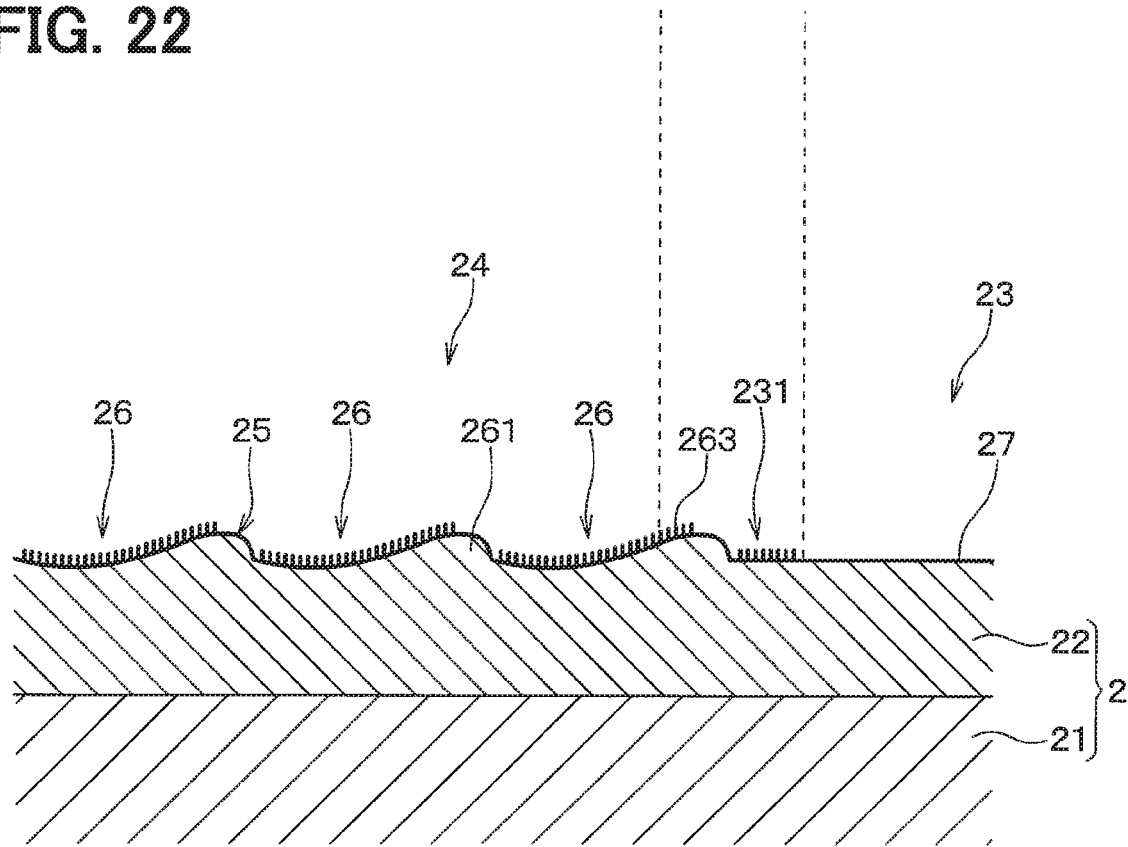
FIG. 22 is a partially enlarged cross-sectional view of the support member in a manufacturing step of a variation example of the electronic device of the second embodiment.
Figure 23:
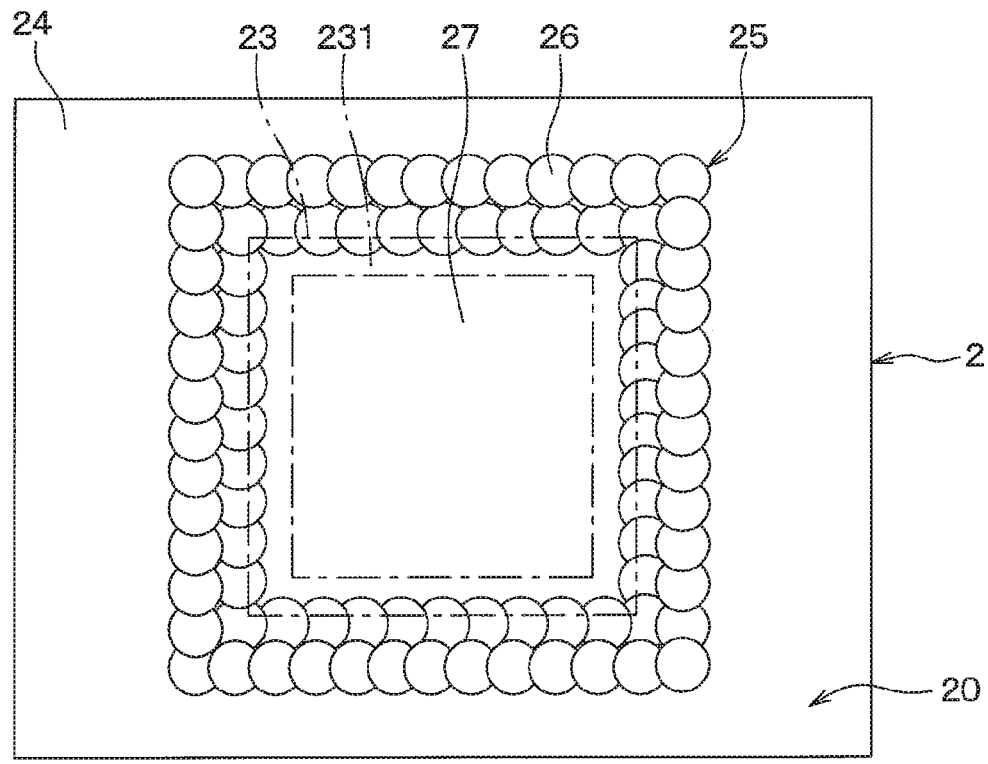
FIG. 23 is a plan view of the support member in the manufacturing step of the variation example of the electronic device.

As shown in FIG. 22, the post-processing beam can be projected also to the laser irradiation marks 26 adjoining the non-laser-irradiated region 27 in the in-plane direction in addition to the outer edge of the non-laser-irradiated region 27. In this case, as shown in FIG. 23, the boundary area 231 includes the outer edge of the non-laser-irradiated region 27 (i.e., inner edges of the rough surface 25), and some parts of the plurality of laser irradiation marks 26 adjoining the outer edge in the in-plane direction and arrayed in a rectangular shape when viewed in plan.

Figure 24:
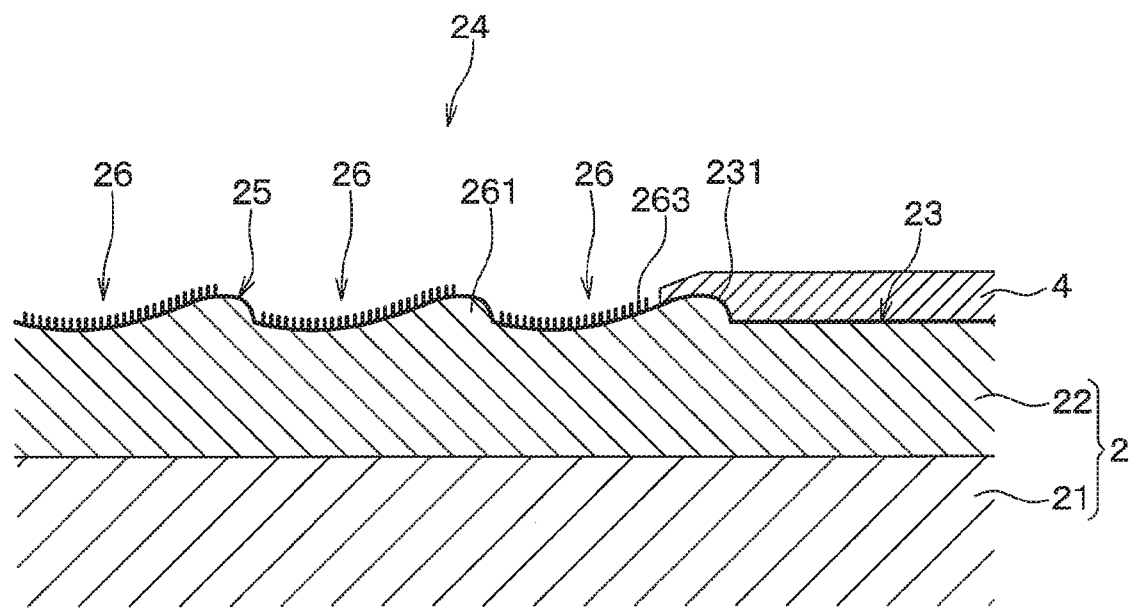
FIG. 24 is a partially enlarged cross-sectional view of the support member and others in the manufacturing step of the variation example of the electronic device.

This will cause the conductive bonding layer 4 to make tight contact with parts of laser irradiation marks 26 included in the boundary area 231, as shown in FIG. 24. With this structure, an outer edge of the conductive bonding layer 4 form a favorable firm bond with the placement surface 23 because of the irregularities provided by the laser irradiation marks 26. Therefore, with this structure, the bond with the conductive bonding layer 4 on the placement surface 23 can be secured even more favorably.

The outer shape in a plan view of the placement surface 23 is not limited to the rectangular shape such as the one shown in FIG. 13. Considering the internal stress, however, it is preferable for the material forming the conductive bonding layer 4 to have a good wettability at positions corresponding to corner parts of the electronic component 3, as mentioned above. Therefore, the placement surface 23 is preferably irradiated with the post-processing beam at least in positions corresponding to corner parts of the electronic component 3. Namely, the placement surface 23 having a good wettability for the material forming the conductive bonding layer 4 can be formed such that square parts of the corners protrude outward in the in-plane direction in a plan view.

Figure 25:
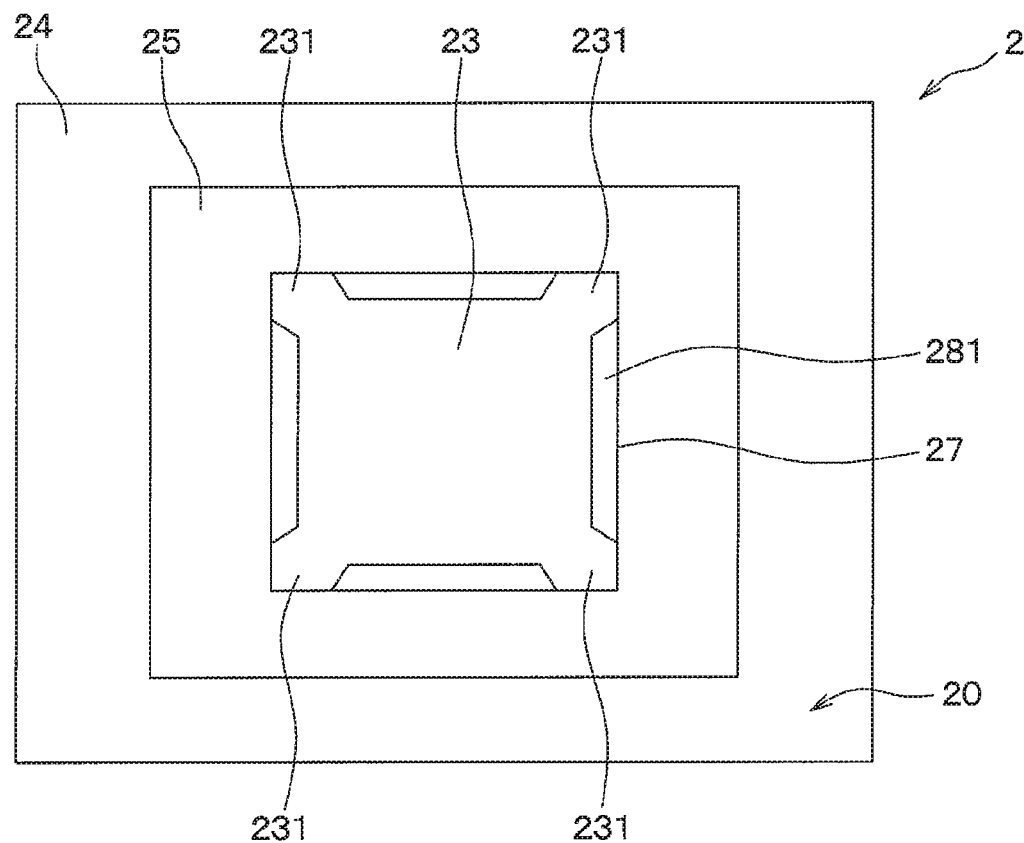
FIG. 25 is a plan view illustrating a schematic configuration of another variation example of the electronic device of the second embodiment.

In the example shown in FIG. 25, for example, the placement surface 23 has a planar shape, with four margin areas 281 being eliminated from the non-laser-irradiated region 27 that is rectangular. A boundary area 231 is provided to each of four corners of the non-laser-irradiated region 27 that is rectangular. The margin area 281 is formed in a trapezoidal shape, the lower base being positioned outside relative to the upper base. The margin area 281 is positioned such that its lower base contacts each side of the non-laser-irradiated region 27 that is rectangular. Namely, the margin area 281 is provided between two boundary areas 231 adjoining in the up and down direction or in the left to right direction in the drawing. In other words, the placement surface 23 is formed as a region where a rectangular area inside the non-laser-irradiated region 27 and four boundary areas 231 that are generally rectangular and protrude respectively from four corners of this rectangular area overlapping one upon another.

In the margin area 281 provided between the placement surface 23 and the rough surface 25, the wettability for the material forming the conductive bonding layer 4 may be deteriorated. In such a structure, however, the margin area 281 is not provided to positions corresponding to corner parts of the electronic component 3. Namely, the boundary areas 231 at positions corresponding to the corner parts of the electronic component 3 are formed with a good wettability for the material forming the conductive bonding layer 4. Meanwhile, corners in inner edges of the rough surface 25 adjoining the outside of the boundary areas 231 in the in-plane direction form a favorable bond with the resin member 5. Therefore, with this structure, peeling and/or cracks of the conductive bonding layer 4 can favorably be prevented from occurring near corner parts of the electronic component 3.

Figure 26:
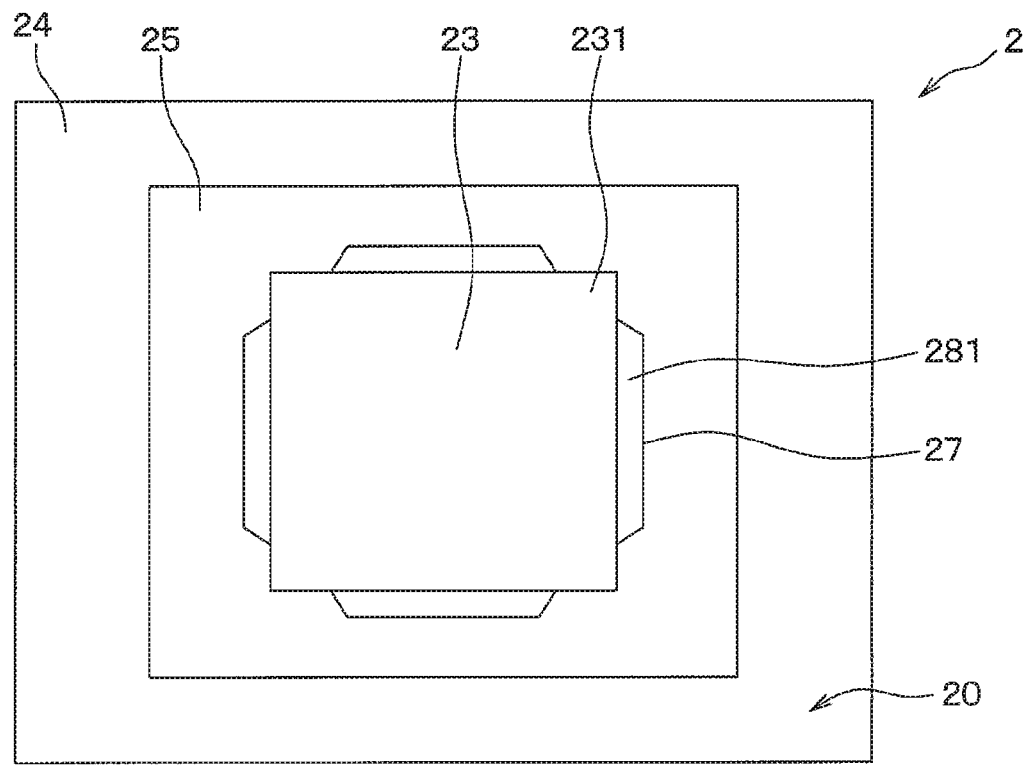
FIG. 26 is a plan view illustrating a schematic configuration of yet another variation example of the electronic device of the second embodiment.

Even if the placement surface 23 is rectangular, margin areas 281 can be provided at positions other than corners. For example, in the example shown in FIG. 26, corners in the inner edges (i.e., inner corners) of the rough surface 25 formed in a frame shape as viewed in plan have a fan shape protruding toward the placement surface 23. Namely, the inner corners of the rough surface 25 include fan-shaped parts protruding toward a central part in the in-plane direction of the placement surface 23. Boundary areas 231 are formed by irradiating some parts of these fan-shaped areas (i.e., distal end portions in the protruding direction) with the post-processing beam. In such a structure, too, the margin area 281 is not provided at positions corresponding to corner parts of the electronic component 3. Accordingly, peeling and/or cracks of the conductive bonding layer 4 can favorably be prevented from occurring near corner parts of the electronic component 3.

Figure 27:
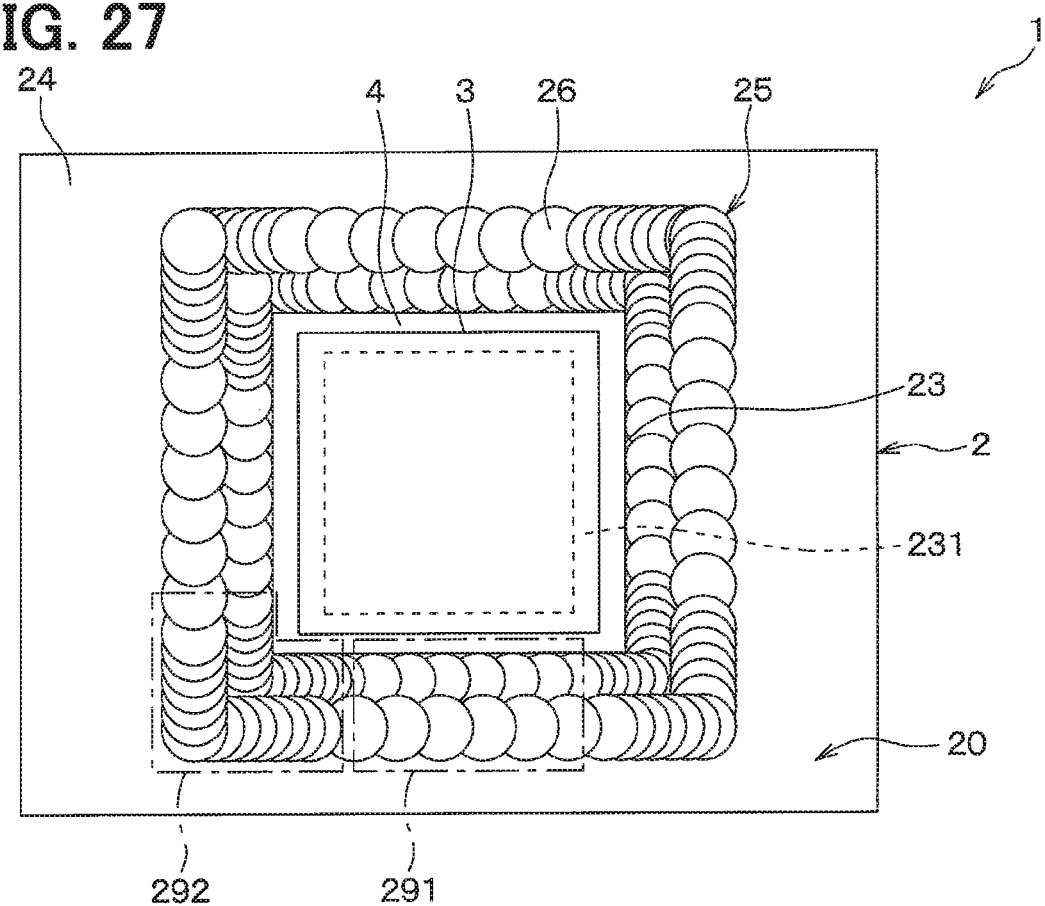
FIG. 27 is a plan view illustrating a schematic configuration of yet another variation example of the electronic device of the second embodiment.

As shown in FIG. 27, the rough surface 25 may include a first region 291 and a second region 292. A plurality of laser irradiation marks 26 are formed each in the first region 291 and second region 292. The second region 292 has a higher density of laser irradiation marks 26 in the in-plane direction than that of the first region 291. More specifically, in the present variation example, the second region 292 is formed by setting the laser beam irradiation density 1.25 times or more higher than that of the first region 291.

In the present variation example, the second region 292 is provided correspondingly to portions of the joint between the support member 2 and the conductive bonding layer 4 and resin member 5 where internal stress is higher than other parts. More specifically, the second region 292 is provided in areas near corner parts of the electronic component 3. Namely, the second region 292 is provided in corner parts of the planar shape of the rough surface 25 that is rectangular.

In the second regions 292 having a higher density of laser irradiation marks 26 than that of the first regions 291, the amount of vaporization and deposition of metal caused by laser beam irradiation is relatively high. Therefore, the second protrusions 262 in the second region 292 are formed higher than the second protrusions 262 in the first region 291. This means that the bond between the support member 2 and the resin member 5 is enhanced even more near corner parts of the electronic component 3.

Meanwhile, there is a risk that wettability for the material forming the conductive bonding layer 4 may be deteriorated as mentioned above in the boundary areas 231 that form an outer edge of the placement surface 23. The risk is high particularly at positions near the second regions 292 having a high density of laser irradiation marks 26. In the present variation example, however, the boundary areas 231 are also irradiated with the post-processing beam. Therefore, even though the second regions 292 having a high density of laser irradiation marks 26 are provided in areas near the corner parts of the electronic component 3, the wettability for the material forming the conductive bonding layer 4 is favorable in parts of the boundary areas 231 positioned correspondingly to the corners of the electronic component 3. Therefore, with this structure, a good bond with the conductive bonding layer 4 on the placement surface 23 is secured, while a favorable bond is also realized between the sealing surface 24 and the resin member 5. Also, the possibility of failures such as peeling and/or cracks of the conductive bonding layer 4 resulting from internal stress, or peeling and the like of the resin member 5, are reduced as much as possible.

In the present variation example, the second regions 292 having a high density of laser irradiation marks 26 are not provided to the entire rough surface 25 but only to necessary parts. More specifically, the second region 292 is selectively formed near a starting point and near an end point of a unidirectional travel of the laser beam on the mounting surface 20. According to the present variation example, a favorable bond can be secured while an increase in processing time is minimized.

The manner in which the laser irradiation marks 26 are formed in the first regions 291 and second regions 292 is not limited to the specific examples described above. For example, some parts of the first region 291 may not have the laser irradiation marks 26. The density of the laser irradiation marks 26 formed in the second region 292 may be constant, or, the second region 292 may have specific areas where the formation density is particularly high.

Figure 28:
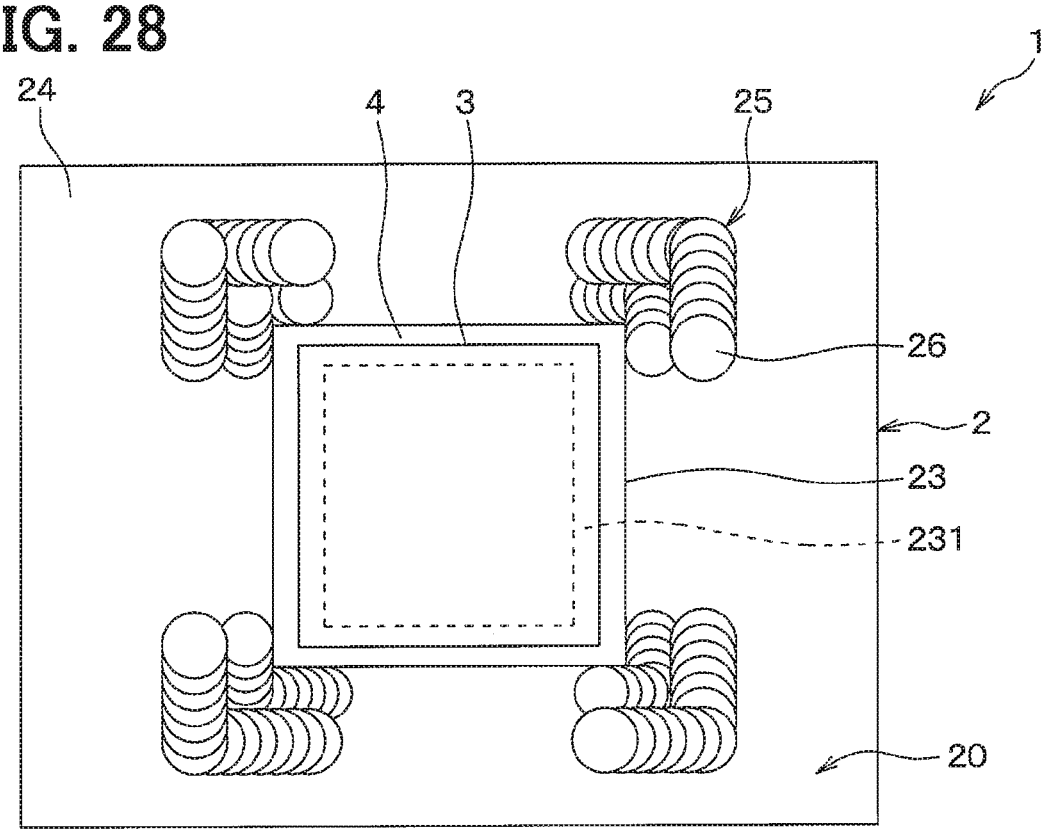
FIG. 28 is a plan view illustrating a schematic configuration of yet another variation example of the electronic device of the second embodiment.

As shown in FIG. 28, the rough surface 25 may be provided only at positions corresponding to portions of the joint between the support member 2 and the conductive bonding layer 4 and resin member 5 where internal stress is higher than other parts. More specifically, the rough surface 25 may be provided in areas near corner parts of the electronic component 3. The structure of the laser irradiation marks 26 in the example shown in FIG. 28 is also the same as those of the embodiments described above (see FIG. 14 and FIG. 15).

Variation examples are not limited to the examples illustrated above. Namely, various variation examples can be combined with each other. Also, various embodiments can be combined with each other. Moreover, all or some of the variation examples described above can be combined with combinations of various embodiments as required.

The invention claimed is:

1. An electronic device in which an electronic component is mounted through a conductive bonding layer, the electronic device comprising:
   a support member that includes
      a metallic placement surface joined to the conductive bonding layer, and
      a metallic sealing surface provided on an outer side of the placement surface in an in-plane direction of the placement surface to adjoin the placement surface and to surround the placement surface; and
   a resin member, which is a synthetic resin molded article, joined to the sealing surface and covering the electronic component, wherein:
   the sealing surface includes a rough surface having a plurality of laser irradiation marks having a substantially circular shape;
   the rough surface includes a first region and a second region, the second region having a higher density of the laser irradiation marks in the in-plane direction than the first region;
   the rough surface includes
      a plurality of first protrusions provided correspondingly to the laser irradiation marks and having a height of 0.5 µm to 5 µm, and
      a plurality of second protrusions provided inside the first protrusions and/or around the first protrusions, and having a height of 1 nm to 500 nm and a width of 1 nm to 300 nm;
   the second protrusions in the second region are taller than the second protrusions in the first region.

2. The electronic device according to claim 1, wherein:
   the second region is provided correspondingly to a portion of a joint between the support member and the conductive bonding layer or between the support member and the resin member; and
   internal stress is higher at the portion of the joint with the second region than in other portions of the joint.

3. The electronic device according to claim 1, wherein:
   the electronic component has a rectangular shape as a planar shape; and
   the second region is provided in portions near four corners of the rectangular shape of the electronic component.

4. The electronic device according to claim 3, wherein the second region is provided at a portion near each side of the rectangular shape of the electronic component.

5. The electronic device according to claim 1, wherein the rough surface is provided such that two adjacent second protrusions are spaced apart by 1 nm to 300 nm.

6. The electronic device according to claim 1, wherein the second protrusions in the second region are taller than the second protrusions in the first region.

* * * * *